United States Patent
Plasterer et al.

(10) Patent No.: US 7,288,971 B1
(45) Date of Patent: Oct. 30, 2007

(54) SYSTEMS AND METHODS FOR ACTIVELY-PEAKED CURRENT-MODE LOGIC

(75) Inventors: John P. Plasterer, Burnaby (CA); William Michael Lye, Coquitlam (CA); Matthew W. McAdam, Vancouver (CA)

(73) Assignee: PMC-Sierra, Inc., Santa Clara, CA (US)

( * ) Notice: Subject to any disclaimer, the term of this patent is extended or adjusted under 35 U.S.C. 154(b) by 0 days.

(21) Appl. No.: 11/691,859

(22) Filed: Mar. 27, 2007

Related U.S. Application Data

(63) Continuation of application No. 10/820,381, filed on Apr. 8, 2004, now Pat. No. 7,202,706.

(60) Provisional application No. 60/462,089, filed on Apr. 10, 2003.

(51) Int. Cl.
  *H03K 19/20* (2006.01)
  *H03K 19/094* (2006.01)

(52) U.S. Cl. .................. 326/127; 326/115; 326/126

(58) Field of Classification Search ............ 326/62–63, 326/68, 80, 86, 90, 115, 12
See application file for complete search history.

(56) References Cited

U.S. PATENT DOCUMENTS

| | | | |
|---|---|---|---|
| 6,788,103 B1 * | 9/2004 | Feldman et al. | ............... 326/34 |
| 2004/0227573 A1 * | 11/2004 | Soda | ........................ 330/253 |

* cited by examiner

*Primary Examiner*—Anh Q. Tran
(74) *Attorney, Agent, or Firm*—Knobbe Martens Olson & Bear LLP

(57) ABSTRACT

A method and apparatus for creating high speed logic circuits in a CMOS environment using current steering logic cells with actively-peaked NMOS or PMOS loads and the biasing of these logic cells is disclosed. The logic cells can include, for example, buffers, AND gates, OR gates, flip-flops, and latches. The current steering cells with actively-peaked loads can provide benefits such as reduced power consumption, smaller area, and higher speed performance over conventional devices. This performance boost is preferably achieved using NMOS followers with resistively degenerated gates to create frequency peaked transfer function of current-mode logic cells. These logic cells with actively-peaked loads can advantageously be used in circuits in which relatively good power area and performance are desired for state machine logic, parallel to serial conversions, serial to parallel conversions, and the like.

23 Claims, 15 Drawing Sheets

SYSTEMS AND METHODS FOR ACTIVELY-PEAKED CURRENT-MODE LOGIC

RELATED APPLICATION

This application is a continuation application of U.S. application Ser. No. 10/820,381, filed Apr. 8, 2004 now U.S. Pat. No. 7,202,706, which claims the benefit under 35 U.S.C. § 119(e) of U.S. Provisional Application No. 60/462,089, filed Apr. 10, 2003, the disclosures of each of which are hereby incorporated by reference in their entireties herein.

FIELD OF THE INVENTION

The invention generally relates to circuits. In particular, the invention relates to relatively-high speed differential logic circuits.

BACKGROUND OF THE INVENTION

Engineers have approached the problem of processing digital signals at high frequencies over the last three decades. Typically the industry has been working with two types of transistor processes to deal with digital logic functions: bi-polar and Complementary Metal Oxide Semiconductors (CMOS). The bipolar process provides higher processing speeds due to the inherent ability of bipolar circuits to operate faster. However, typical bipolar designs have high power usage and a low level of integration. CMOS transistor processes have the advantage of very high levels of integration and relatively low power consumption as compared to their bi-polar cousins.

Since the CMOS process is typically slower than bi-polar, engineers must innovate in order to increase operating frequencies of logic in the technology. This has lead to many different approaches to logic families using CMOS process technology. Many different methods exist for implementing high-speed logic. Conventional logic families include conventional CMOS, current-mode logic (CML), and current mode logic with inductive broadbanding. These circuits are designed using deep sub-micron technologies.

These technologies need to be viewed with a comparison of different parameters. For high-speed data processing there are a number of important parameters: speed, power, and area. The most important of the parameters is typically operating frequency or speed. The speed of a logic family is determined by its propagation delay, the time it takes for a logic state to pass from the input to the output. Speed and operating frequency will be used interchangeably herein. The power of the circuit is the amount of current drawn multiplied by the power supply. The area of a circuit is the amount of silicon that the circuit consumes to perform a given operation. Power and area should typically be reduced as much as possible in order to have the highest levels of integration on a device.

Representative examples of conventional logic families will now be described. In particular, conventional CMOS logic families, CML logic families, and CML with inductive broadbanding families will be described. These specific implementations are discussed with respect to the parameters described earlier.

Conventional CMOS

The conventional low power high-density logic family used in the industry today is conventional CMOS logic. This logic family uses rail-to-rail logic that has virtually no static current and thus draws relatively little power. It consumes only a small amount of area. However, it has the drawback that it is relatively slow from what is required in the industry today. For the rest of this patent disclosure "conventional CMOS logic" and "CMOS logic" will both be used interchangeably.

A CMOS logic gate uses both PMOS and NMOS transistors. FIG. 1 shows a typical NAND gate. The PMOS transistors are used to evaluate a "1" state and the NMOS transistors are used to evaluate a "0" state.

The issue with this method of logical function is that the PMOS devices generally need to be sized large than the NMOS transistors because of the fact that the mobility in PMOS ($\mu_p$) is significantly lower than in the NMOS ($\mu_n$). The capacitance of a CMOS gate is large and the larger devices cause additional loading. The best performance can be achieved with a PMOS to NMOS width ratio defined by Equation 1. See also, J. M. Rabaey, Digital Integrated Circuits. Englewood Cliffs, N.J.: Prentice-Hall, 1996.

$$\frac{W_p}{W_n} = \sqrt{\frac{\mu_n}{\mu_p}} \qquad \text{Equation 1}$$

CMOS logic, however, has superior noise immunity. This allows CMOS circuits to operate with lower voltages and with smaller transistor sizes without significant degradation in performance. See also M. Anis, M. Allam, M. Elmasry, "Impact of Technology Scaling on CMOS Logic Styles," IEEE Trans. on Circuits and Systems-II: Analog and Digital Signal Processing, Vol. 49, pp. 577-587, August 2002. CMOS logic has high noise margin due to a static path that restores correct logic state in the presence of noise. The noise margin can also be attributed to its large output voltage swing since a logic "1" is identified with a voltage output equal to the supply rail ($V_{DD}$) and a logic "0" is identified with an output voltage equal to ground ($V_{SS}$). This large swing means it requires large amounts of voltage noise to switch logic states.

Overall, CMOS logic is the technology standard for high-density processing of digital logic. However, it has severe speed limitations that prevent its usage in many high-speed applications. Engineers have attempted on improving CMOS logic by innovation. Some of these techniques are discussed further.

Current-Mode Logic

One method in which engineers have attempted to improve the performance of logic functions in CMOS is to use a logic family originally called "MOS Current-Mode Logic" (MCML). See, for example, M. Yamashina and H. Yamada, "An MOS current mode logic (MCML) circuit for low-power sub-GHz processors," IEICE Trans. Electron., vol. E75-C, pp. 1181-1187, October 1992; and U.S. Pat. No. 6,424,194 to Hairapetian. MCML is an improvement over CMOS since it uses only of NMOS transistors, which are inherently faster than PMOS transistors. The industry has developed many names for this technology and variations of it, such as the term "SCL." See, for example, S. Kiaei, S. Chee, D. Allstot, "CMOS Source-Coupled Logic for Mixed-Mode VLSI," IEEE International Symposium on Circuits and Systems (23rd: 1990: New Orleans) pgs. 1608-1611; and J. Kundan, and S. Hasan, "Enhanced Folded Source-Coupled Logic Technique for Low-Voltage Mixed-Signal Integrated Circuits," IEEE Trans. on Circuits and Systems-II: Analog and Digital Signal Processing, Vol. 47, pp.

810-817, August 2000. The term "C³MOS" has also been used to refer to current-mode logic and variations on the same principles. See, for example, U.S. Pat. No. 6,424,194 to Hairapetian and U.S. Pat. No. 6,340,899 to Green. This type of logic will be referred to herein as "CML."

A rudimentary CML logic cell is the CML buffer. The CML buffer is shown in FIG. 2. It uses two NMOS input transistors ($M_P$ and $M_N$), two output load resistors ($R_P$ and $R_N$), and a tail current source of current value ($I_{tail}$). The inputs are labeled as $I_P$ and $I_N$. The outputs are denoted with labels $O_P$ and $O_N$.

Current-Mode Logic operates on switching the current ($I_{tail}$) with the differential pair ($M_P$ and $M_N$) between the output resistive loads ($R_P$ and $R_N$). When the input voltage difference, $I_P$-$I_N$, is a positive potential more current is steered towards the resister $R_N$ than towards the resistor $R_P$. This effectively drops the voltage on the output $O_N$ and raises the voltage on output $O_P$, which results in a positive difference on the output nodes ($O_P$-$O_N$). A positive difference indicates a logic "1." Similarly, when the input voltage difference, $I_P$-$I_N$, is negative more current is steered towards the resistor $R_P$ than towards $R_N$. This lowers the voltage on output $O_P$ while increasing the voltage on output $O_N$, which results in a negative difference on the output nodes ($O_P$-$O_N$). A negative difference indicates a logic "0."

Logic functions of an "AND" and an "OR" can also be implemented. The implementation of an AND is shown in FIG. 3. The AND logic function is implemented in current mode logic with two differential NMOS transistor pairs, an NMOS tail current sources with current value ($I_{tail}$), and resistor loads ($R_P$ and $R_N$).

Storage elements may also be created using these elements. A latch can also be created using these elements and is shown in FIG. 4. See also, M. Yamashina and H. Yamada, "An MOS current mode logic (MCML) circuit for low-power sub-GHz processors," IEICE Trans. Electron., vol. E75-C, pp. 1181-1187, October 1992.

The resistance ($R_P$ and $R_N$) and the parasitic capacitance determine the speed of the CML cell. The frequency limitation is approximately inversely proportional to the resistance multiplied by the parasitic capacitance. The resistance is determined by the desired output swing (the maximum $O_P$-$O_N$) divided by the desired tail current ($I_{tail}$). The parasitic capacitance of the output is a combination of parasitic wiring capacitance, capacitance of the drains of the differential pair devices, capacitance of the resistive load and capacitance of the gates of differential pairs in subsequent stages of logic.

The gain of a CML cell is generally defined as ($O_P$-$O_N$)/($I_P$-$I_N$). The small signal gain of the CML buffer is determined by multiplying the small signal gain ($g_m$) of the differential pair ($M_P$ and $M_N$) by the resistor load ($R_P$ and $R_N$). The gain of the cell is important since, in order to retain signal strength and increase immunity to noise sources, the gain of the cells must be greater than 1. This remains true over all process, voltage and temperature variations apparent in the circuit.

A significant variation in gain can occur because of the independent variation of $g_m$ and resistance over process, voltage and temperature. This extreme variation can lead to difficulties in optimizing of the circuit parameters. This is a significant issue, since the output parasitic capacitance, which directly effects the speed of the cells, has a large dependence on the size of the differential pair ($M_P$/$M_N$). The smaller the differential pair, for a given tail current ($I_{tail}$) and load resistor ($R_P$/$R_N$), the smaller the gain. Advantageously, the large gain variation limits the minimum transistor size of the differential pair.

The important features of CML are its differential nature and its overall speed. Differential inputs and outputs means that it can have a higher tolerance to noise since the logic state is determined by the difference in voltage potentials and not the absolute voltage potential. CML logic uses only NMOS transistors that are much faster than PMOS transistors. This is because the mobility in NMOS transistors is higher than in PMOS transistors and it accordingly takes a much smaller device to provide the same switching performance than would a PMOS transistor.

Although the operating speeds are much faster than conventional CMOS logic, current-mode logic is still limited in operating frequencies. The speed limitation comes from the parasitic capacitance on the output and the resistor load. Further speed enhancements are required in order to design leading edge high-speed logic.

In summary, current-mode logic provides a reliable method to improve the overall speed performance from the existing CMOS logic. Logic functions and flip-flops using CML are fairly fast and have a reasonably high noise immunity due to its differential nature. However, these cells have significant gain variation over process, voltage and temperature and do not have a bandwidth high enough to handle many of the high-speed applications in leading edge designs.

Current-Mode Logic with Inductive Broadbanding

In order to extend the bandwidth of the CML logic cells, inductive broadbanding techniques can be employed. See, for example, U.S. Pat. No. 6,424,194 to Hairapetian. Using this method, an inductor is placed in series with the resistor. The inductor provides a high frequency boost in order to allow for operation at data rates significantly higher than with regular CML. This technique extends the bandwidth of the CML cells to levels far beyond what is attainable with a purely resistive load.

This technique, illustrated in FIG. 5, increases the overall bandwidth and edge rates of a CML buffer by adding a spiral inductor in series with the resistive output element. This spiral inductor resists the change in current and increases the effective impedance at the output for higher frequencies. This effectively offsets some of the capacitive loading effects and increases overall bandwidth.

The output impedance of the buffer can be analyzed using conventional Laplace-transform analysis techniques. FIG. 6 shows the equivalent model of a single ended buffer load with inductive broadbanding and without inductive broadbanding. Where R represents the resistive element in the respective techniques and L represents the inductive elements in the inductive broadbanding technique. The capacitance on the output $C_P$ represents the combined parasitic elements of the output of the buffer.

The output impedance $Z_{in}$ 602 of a purely resistive CML buffer without inductive broadbanding 600 can be summarized in the Laplace frequency domain by Equation 2. See, for example, 22. Ronald E. Thomas and Albert J. Rosa, The Analysis and Design of Linear Circuits, Chapter 10. Englewood Cliffs, New Jersey: Prentice Hall, 1994.

$$Z_{in} = \frac{R}{1 + RC_P s} \quad \text{Equation 2}$$

A CML buffer with inductive broadbanding 610 has an output impedance $Z_{in}$ 612 that can be summarized with Equation 3.

$$Z_{in} = \frac{R + Ls}{LCs^2 + RCs + 1} \qquad \text{Equation 3}$$

The output impedance of the CML buffer with inductive broadbanding 610 with various inductor values is compared to the purely resistive CML buffer without inductive broadbanding 600 in FIG. 7. The plot shows the obvious improvement in the output impedance of the CML buffer with inductive broadbanding 610 at high frequencies as compared to the purely resistive CML buffer without inductive broadbanding 600. The impedance of the output stage remains larger for higher frequencies than occurs without any inductive broadbanding.

A relatively good magnitude of the inductor used for the inductive broadbanding is linearly proportional to the resistance. See, for example, 10. U.S. Pat. No. 6,340,899 to Green. The output swing ($O_P$-$O_N$) of the CML buffer with inductive broadbanding 610 is equal to the tail current multiplied by the resistance of the load. The desired output swing in many applications is limited by noise tolerance of the system so that for the purposes of circuit optimizations, the swing should remain constant when changing the tail current source. Since the output swing is relatively constant and the inductance magnitude is proportional to the resistance, the magnitude of the inductor is typically scaled inversely with the tail current. For this reason, smaller tail currents typically result in a larger value for the inductors.

Spiral inductors used in implementations of the passive inductor loads consume a relatively large area on silicon. Since the area of the inductor eventually becomes severely restrictive, this places limitations on the smallest possible tail current applicable for the CML buffer with inductive broadbanding 610. Larger tail currents lead to larger power consumption of the CML.

The DC gain of the CML buffer with inductive broadbanding 610 is the same as that of the purely resistive CML buffer without inductive broadbanding 600. The gain is equal to the small signal gain of the differential pair ($g_m$) multiplied by the resistance. This leads to the same type of gain variation as can be seen with the purely resistive CML buffer without inductive broadbanding 600. The similar gain variation leads to the same type of gain related issues as seen with the purely resistive CML buffer without inductive broadbanding 600. For example, the gain variation can render it relatively difficult to select a circuit device size for relatively high operating speeds.

Overall, the CML buffer with inductive broadbanding 610 has a further speed improvement over a purely resistive CML structure that allows for its use in high-speed applications. However, the CML buffer with inductive broadbanding 610 consumes relatively large amounts of area and power and is limited by the same gain variation issues that are seen with the purely resistive CML buffer without inductive broadbanding 600.

Other References

In addition, high-speed differential logic structures are described in the following publications, the disclosures of which are hereby incorporated herein by reference in their entirety: M. Yamashina and H. Yamada, "An MOS current mode logic (MCML) circuit for low-power sub-GHz processors," IEICE Trans. Electron., vol. E75-C, pp. 1181-1187, October 1992; M. Allam, and M. Elmasry, "Dynamic Current Mode Logic (DyCML): A New Low Power High-Performance Logic Style", IEEE J. Solid-State Circuits, Vol. 36, pp. 550-558, March 2001; S. Hara, T. Tokumitsu, T. Tanaka, and M. Aikawa, "Broadband monolithic microwave active inductor and its application to miniaturized wide-band amplifiers," IEEE Trans. Microwave Theory Tech., vol. MTT-36, pp. 1920-1924, December 1998; Tanabe, M. Umetani, I. Fujiwara, T. Ogura, K. Kataoka, M. Okihara, H. Sakuraba, T. Endoh, and F. Masuoka, "0.18 um CMOS 10-Gb/s Multiplexer/Demultiplexer ICs Using Current Mode Logic with Tolerance to Threshold Voltage Fluctuation," IEEE J. Solid-State Circuits, Vol. 36, pp. 988-996, June 2001; Tanabe, M. Umetani, I. Fujiwara, T. Ogura, K. Kataoka, M.Okihara, H. Sakurab, "A 10-Gb/s Demultiplexer IC in 0.18 um CMOS using Current Mode Logic with Tolerance to the Threshold Voltage Fluctuation," IEEE International Solid-State Circuits Conference (47th: 2000: San Francisco) pgs. 62-63; S. Kiaei, S. Chee, D. Allstot, "CMOS Source-Coupled Logic for Mixed-Mode VLSI," IEEE International Symposium on Circuits and Systems (23rd: 1990: New Orleans) pgs. 1608-1611; J. Kundan, and S. Hasan, "Enhanced Folded Source-Coupled Logic Technique for Low-Voltage Mixed-Signal Integrated Circuits," IEEE Trans. on Circuits and Systems-II: Analog and Digital Signal Processing, Vol. 47, pp. 810-817, August 2000; U.S. Pat. No. 6,424,194 to Hairapetian; U.S. Pat. No. 6,340,899 to Green; U.S. Pat. No. 6,028,454 to Elmasry, et al.; U.S. Pat. No. 6,320,422 to Koh; U.S. Pat. No. 5,892,382 to Ueda, et al.; U.S. Pat. No. 5,216,295 to Hoang; U.S. Pat. No. 5,945,858 to Sato; U.S. Pat. No. 5,877,642 to Takahashi; U.S. Pat. No. 6,501,314 to Ling; U.S. Pat. No. 4,333,020 to Maerder; U.S. Pat. No. 6,014,041 to Somasekhar, et al.; U.S. Pat. No. 5,726,613 to Hayashi, et al.; and U.S. Pat. No. 5,202,655 to Hara.

Problem Statement

High-speed circuit design in CMOS for leading edge applications has strict requirements for speed, power, and area. Speed is typically required in order for circuits to operate at high data rates and process, transmit, and receive large amounts of data quickly. This speed ideally comes at a minimum cost in power consumption since thermal requirements make high power circuits less cost effective. Minimized area is also desirable to get the highest level of integration possible.

The current state of the art in this area includes conventional CMOS, CML and CML with inductive broadbanding. Conventional CMOS logic has excellent area and power performance, but is limited in its operating speed. The limitation in operating speed is severe enough that it ordinarily can not process data at rates required for leading edge applications. CML circuits have improved speed performance over conventional CMOS logic but are not fast enough for many of the most leading edge applications. CML with inductive broadbanding further increases the speed of resistive CML but consumes an unreasonably large amount of area and power.

A logic family desirably achieves relatively high operating speeds while maintaining relatively low power consumption and relatively small chip area. The current state of the art for high-speed logic circuits using a CMOS process technology has severe limitations for use in low power high frequency applications. Conventional CMOS logic provides a power and area benefit but is severely limited with speed. CML provides some improvements on speed over conventional CMOS, however, does not have the speed required for many leading edge applications and has large gain variations that lead to poorly optimized circuits. CML with inductive broadbanding further improves speed and performance, however, consumes large amounts of area and power, and has the same gain variation issues as purely resistive CML.

SUMMARY OF THE INVENTION

A method and apparatus for creating high speed logic circuits in a CMOS environment using current steering logic cells with actively-peaked NMOS or PMOS loads and the biasing of these logic cells is disclosed. The logic cells can include, for example, buffers, AND gates, OR gates, flip-flops, and latches. The current steering cells with actively-peaked loads can provide one or more advantages over conventional logic cells. For example, embodiments can provide one or more of: reduced power consumption, smaller chip area, and higher speed over conventional logic cells. In one embodiment, this performance boost is at least partially achieved using NMOS followers with resistively degenerated gates to create frequency peaked transfer function of current-mode logic cells. Embodiments can advantageously be applied to virtually any situation in which relatively good power area and performance are desired for state machine logic, parallel to serial conversions, serial to parallel conversions and more.

This disclosure also describes the biasing of the above described logic cells that allow for relatively good peaking levels over standard manufacturing variations of CMOS process parameters, temperature and power supply voltage. This is preferably achieved through the use of a process tracking current bias into a diode connected NMOS which provides a voltage to the follower loads that compensates for the large signal non-linearities of the loads. The bias creates a level shifted voltage bias for relatively good common mode levels for buffers used in driving flip-flops and latches.

One embodiment is a circuit fabricated in an integrated circuit with a differential input and a differential output, the circuit including: a differential circuit with a first NMOS transistor and a second NMOS transistor, where the first NMOS transistor has a source, a gate, and a drain, and the second NMOS transistor has a source, a gate, and a drain, where the source of the first NMOS transistor and the source of the second NMOS transistor are coupled, where the gate of the first NMOS transistor and the gate of the second NMOS transistor are configured to receive the differential input, and where the drain of the first NMOS transistor and the drain of the second NMOS transistor are configured to provide the differential output; a first current source with at least a first terminal, where the first terminal of the first current source is coupled to the source of the first NMOS transistor and to the source of the second NMOS transistor; a first active load with at least a first terminal coupled to the drain of the first NMOS transistor of the differential circuit, where the first terminal of the first active load has an inductive impedance characteristic as seen from the drain of the first NMOS transistor; and a second active load coupled to the drain of the second NMOS transistor of the differential circuit, where the second active load has an inductive impedance characteristic as seen from the drain of the second NMOS transistor.

One embodiment is a digital circuit, including: first and second n-channel devices with their source terminals coupled to a first node, with their gate terminals coupled to receive a first pair of differential logic signals, respectively, and with their drain terminals coupled to a true output and to a complementary output, respectively, of the multiplexing circuit; third and fourth n-channel devices with their source terminals coupled to a second node, with their gate terminals coupled to receive a second pair of differential logic signals, and with their drain terminals coupled to the true output and to the complementary output, respectively; first and second active loads respectively coupling the true output and the complementary output, respectively, to a voltage reference, where the first and second loads exhibit an inductive impedance characteristic without inclusion of an explicit inductor; a first select n-channel device having a drain terminal coupled to the first node, a gate terminal coupled to receive a first select logic signal, and a source terminal; and a second select n-channel device having a drain terminal coupled to the second node, a gate terminal coupled to receive a second select logic signal, and a source terminal.

One embodiment is a current-controlled metal-oxide-semiconductor field-effect transistor (MOSFET) flip-flop circuit, including: a first clocked latch comprising: first and second NMOS transistors with their source terminals coupled together, with their gate terminals coupled to receive a differential logic signal, and with their drain terminals coupled to a first intermediate output and to a second intermediate output, respectively; a first clocked NMOS transistor with a drain terminal coupled to the source terminals of the first and second NMOS transistors, with a gate terminal coupled to a first clock signal, and having a source terminal; third and fourth NMOS transistors with their source terminals coupled together, with their gate terminals and drain terminals respectively cross-coupled to the first intermediate output and to the second intermediate output; a second clocked NMOS transistor having a drain terminal coupled to the source terminals of the third and fourth NMOS transistors, a gate terminal coupled to a second clock signal, and a source terminal; first and second active load circuits respectively coupling the first intermediate output and the second intermediate output to a voltage reference, where the first and second active load circuits exhibit an inductive impedance characteristic without inclusion of an explicit inductor; a second clocked latch comprising: fifth and sixth NMOS transistors with their source terminals coupled together, with their gate terminals coupled to receive the first intermediate output and the second intermediate output, respectively, and with their drain terminals coupled to a first flip-flop output and to a second flip-flop output, respectively, where the first flip-flop output and the second flip-flop output correspond to outputs of the flip-flop circuit; a third clocked NMOS transistor with a drain terminal coupled to the source terminals of the fifth and sixth NMOS transistors, with a gate terminal coupled to the first clock signal, and having a source terminal; seventh and eighth NMOS transistors with their source terminals coupled together, and with their gate terminals and drain terminals respectively cross-coupled to the first flip-flop output and to the second flip-flop output; a fourth clocked NMOS transistor with a drain terminal coupled to the source terminals of the seventh and eighth NMOS transistors, with a gate terminal coupled to the second clock signal, and having a source terminal; and third and fourth active load circuits respectively coupling the first flip-flop output and the second flip-flop output to the voltage reference, where the third and fourth active load circuits exhibit an inductive impedance characteristic without inclusion of an explicit inductor.

One embodiment is an integrated circuit with metal-oxide-semiconductor field-effect transistors (MOSFETs) fabricated on a silicon substrate, the integrated circuit including at least an input circuit implemented with current-controlled complementary metal-oxide semiconductor field-effect transistor circuits configured with active loads, where the active loads mimic the response of inductors without inclusion of an explicit inductor, where the input circuit is configured to receive an input signal at a first data rate, where the first circuit is configured to generate a first output signal with two or more data lines that operates at a data rate that is slower than the first data rate.

One embodiment includes a digital circuit includng: a differential circuit with a first NMOS transistor and a second NMOS transistor, where the first NMOS transistor has a source, a gate, and a drain, and the second NMOS transistor has a source, a gate, and a drain, where the source of the first NMOS transistor and the source of the second NMOS transistor are coupled, where the gate of the first NMOS transistor and the gate of the second NMOS transistor are configured to receive a first differential input, and where the drain of the first NMOS transistor and the drain of the second NMOS transistor are configured to provide the differential output; a second differential circuit with a third NMOS transistor and a fourth NMOS transistor, where the third NMOS transistor has a source, a gate, and a drain, and where the fourth NMOS transistor has a source, a gate, and a drain, where the source of the third NMOS transistor and the source of the fourth NMOS transistor are coupled, where the gate of the third NMOS transistor and the gate of the fourth NMOS transistor are configured to receive a second differential input, where the drain of the third NMOS transistor is coupled to the source of the first NMOS transistor and to the source of the second NMOS transistor, and where the drain of the fourth NMOS transistor is coupled to the drain of the second NMOS transistor and to part of the differential output; a current source with at least a first terminal, where the first terminal of the current source is coupled to the source of the third NMOS transistor and to the source of the fourth NMOS transistor; a first active load with at least a first terminal coupled to the drain of the first NMOS transistor, where the first terminal of the first active load has an inductive impedance as seen from the drain of the first NMOS transistor; and a second active load coupled to the drain of the second NMOS transistor, where the second active load has an inductive impedance as seen from the drain of the second NMOS transistor.

One embodiment is a digital circuit including: a differential circuit with a first NMOS transistor and a second NMOS transistor, where the first NMOS transistor has a source, a gate, and a drain, and the second NMOS transistor has a source, a gate, and a drain, where the source of the first NMOS transistor and the source of the second NMOS transistor are coupled, where the gate of the first NMOS transistor and the gate of the second NMOS transistor are configured to receive a first differential input for a first differential signal, and where the drain of the first NMOS transistor and the drain of the second NMOS transistor are coupled to the differential output; a second differential circuit with a third NMOS transistor and a fourth NMOS transistor, where the third NMOS transistor has a source, a gate, and a drain, and where the fourth NMOS transistor has a source, a gate, and a drain, where the source of the third NMOS transistor and the source of the fourth NMOS transistor are coupled, where the gate of the third NMOS transistor and the gate of the fourth NMOS transistor are configured to be responsive to a second differential signal, and where the drain of the third NMOS transistor is coupled to the drain of the first NMOS transistor and to a portion of the differential output, where the drain of the fourth NMOS transistor is coupled to the drain of the second NMOS transistor and to a portion of the differential output; a third differential circuit with a fifth NMOS transistor and a sixth NMOS transistor, where the fifth NMOS transistor has a source, a gate, and a drain, and where the sixth NMOS transistor has a source, a gate, and a drain, where the source of the fifth NMOS transistor and the source of the sixth NMOS transistor are coupled, where the gate of the fifth NMOS transistor and the gate of the sixth NMOS transistor are configured to receive a differential input for a third differential signal, where the drain of the fifth NMOS transistor is coupled to the source of the first NMOS transistor and to the source of the second NMOS transistor, where the drain of the sixth NMOS transistor is coupled to the source of the third NMOS transistor and to the source of the fourth NMOS transistor; a current source with at least a first terminal, where the first terminal of the current source is coupled to the source of the fifth NMOS transistor and to the source of the sixth NMOS transistor; a first active load with at least a first terminal coupled to the drain of the first NMOS transistor, where the first terminal of the first active load has an inductive impedance as seen from the drain of the first NMOS transistor; and a second active load coupled to the drain of the second NMOS transistor, where the second active load has an inductive impedance as seen from the drain of the second NMOS transistor.

One embodiment is an integrated circuit with metal-oxide-semiconductor field-effect transistors (MOSFETs) fabricated on a silicon substrate, the integrated circuit including at least a differential logic circuit implemented with current-controlled complementary metal-oxide semiconductor field-effect transistor circuits configured with active loads, and where the active loads mimic the response of inductors without inclusion of an explicit inductor. For example, the integrated circuit can be configured to correspond to at least a portion of a buffer, an inverter, an AND gate, a NAND gate, an OR gate, a NOR gate, a multiplexer, a latch, and a flip-flop.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

DETAILED DESCRIPTION OF THE PREFERRED EMBODIMENT

Introduction and Overview

Figure 1:
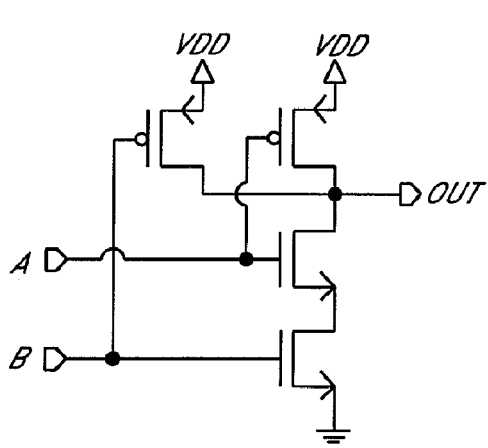
FIG. 1 illustrates a conventional CMOS "NAND" gate.
Figure 2:
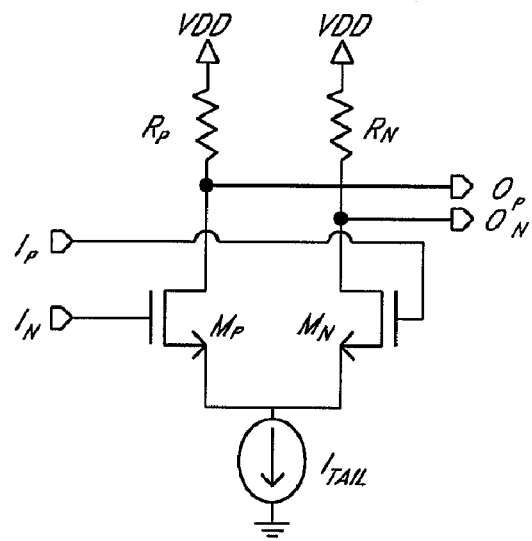
FIG. 2 illustrates a conventional CML buffer.
Figure 3:
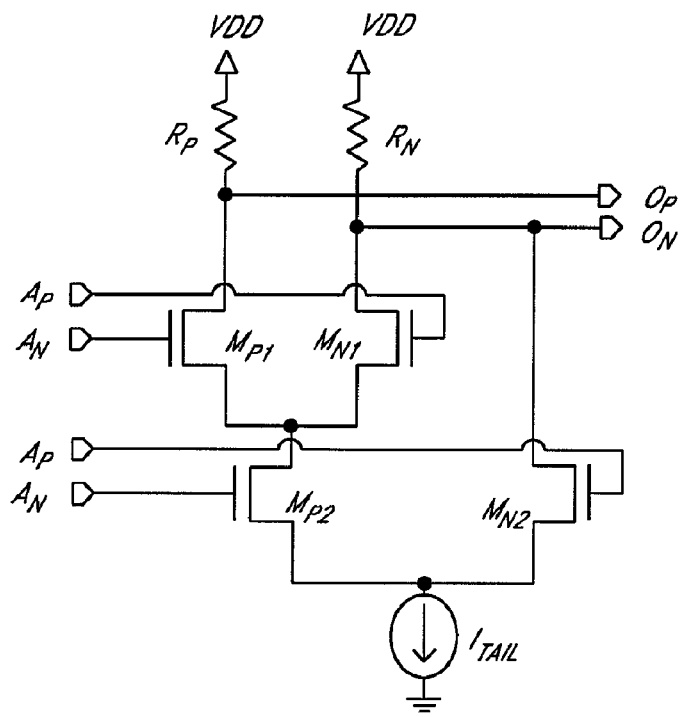
FIG. 3 illustrates a conventional CML "OR" gate.
Figure 4:
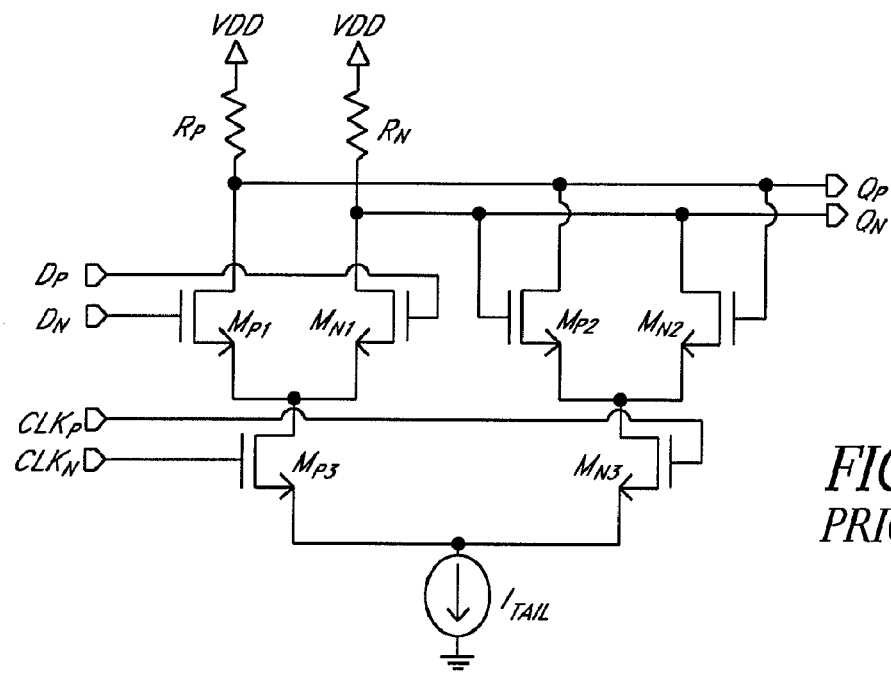
FIG. 4 illustrates a conventional CML latch.
Figure 5:
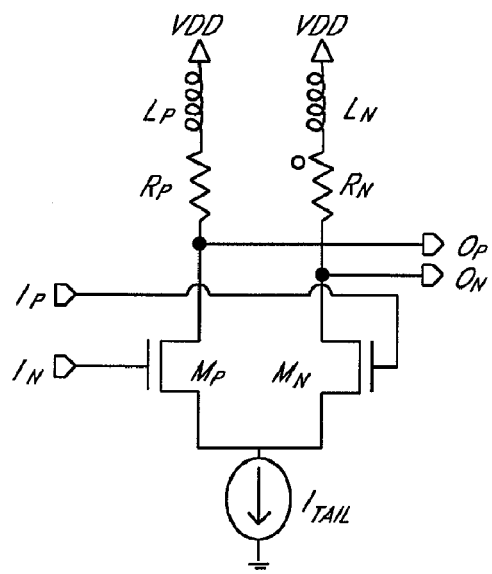
FIG. 5 illustrates a conventional CML buffer with inductive broadbanding.
Figure 6:
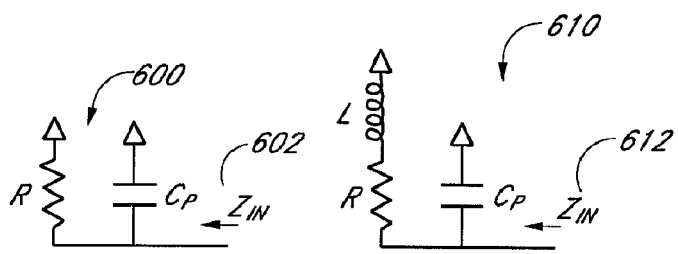
FIG. 6 illustrates an equivalent model of a single-ended buffer load with inductive broadbanding and without inductive broadbanding.
Figure 7:
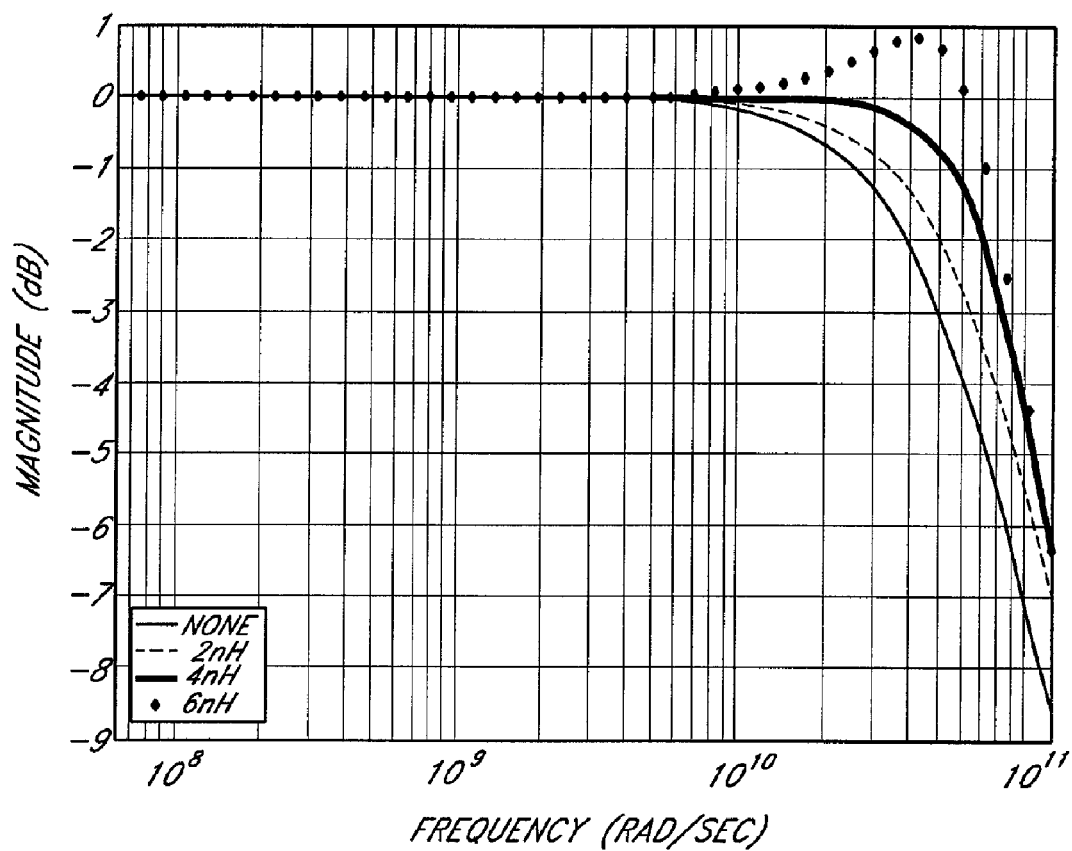
FIG. 7 illustrates an example of a magnitude plot of output impedance of a CML buffer with inductive broadbanding and without inductive broadbanding.
Figure 8:
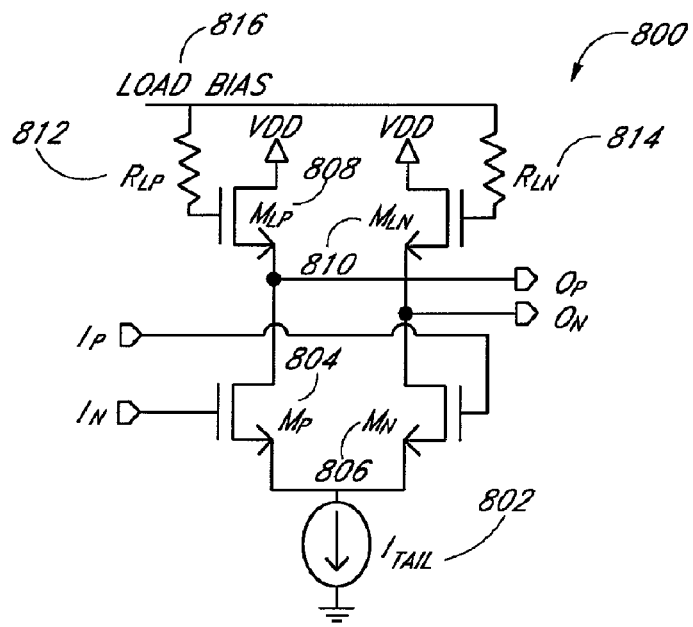
FIG. 8 illustrates one embodiment of an actively-peaked CML buffer.

FIG. 8 illustrates one embodiment of a structure for an actively-peaked current mode logic buffer 800. This logic buffer 800 can be compared with the conventional devices described earlier in connection with FIG. 2 and FIG. 5. As with the conventional devices, a current source 802 drives a differential pair 804, 806. However, the actively-peaked current mode logic buffer 800 is loaded with NMOS transistors 808, 810 with resistors 812, 814 in series with the gates and a special bias 816 for the gates of the NMOS device loads. These NMOS loads 808, 810 are configured in a voltage follower mode that have particular benefits to a high-speed logic family.

These NMOS device loads 808, 810 can be combined to create many different logic structures. These logic structures include an "OR" gate, an "AND" gate, a Mux, and a D-type flip flop. These structures can be created using a combination of differential pairs with the NMOS voltage follower load.

The biasing of the NMOS device loads 808, 810 for the CML uses a process and temperature compensated voltage for the gates of the NMOS transistors 808, 814. The compensation provides for a relatively constant level of peaking over process and temperature variations. Also supplied by the bias is a voltage level shift in order to provide for a lower output buffer common mode. The lower common mode is used to drive the clock inputs for flip-flops for robust operation.

The NMOS loads 808, 810 provide a number of benefits over conventional devices. These benefits include a well controlled logic cell gain over process, voltage and temperature, a low parasitic output capacitance, and a high frequency peaking due to the nature of the voltage follower NMOS loads 808, 810.

These logic cells, flip-flops, and muxes can be combined to create selected logic functions. Specifically, digital information can be processed at high speeds using higher speed but also higher power actively-peaked current-mode logic. The high-speed logic can convert the information to lower rates so that it can be processed using the slower but lower power conventional CMOS circuitry.

Alternatively, the lower speed conventional CMOS logic can pass low speed data to the actively-peaked current-mode logic. The actively-peaked current mode logic can convert the low-speed data into higher rates. This technique can be used in various applications including, but not limited to, backplane drivers, optical interfaces, and serial-deserializer devices.

The actively-peaked current-mode logic cells are described herein as well as the advantageous usage of these cells in industry.

Active Load Structure

Figure 9:
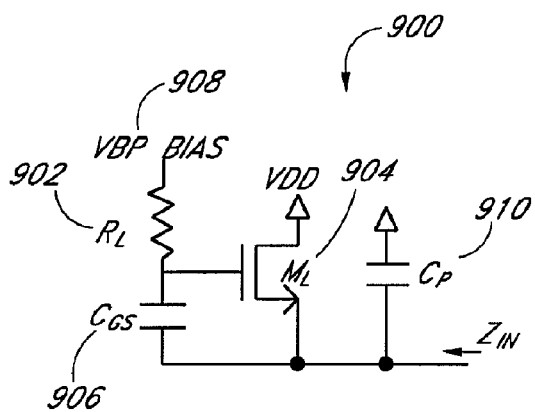
FIG. 9 illustrates one embodiment of an NMOS active load structure.

FIG. 9 illustrates one embodiment of the NMOS active load structure. FIG. 9 illustrates an individual active load element, termed active load structure 900, of the actively-peaked current mode logic buffer 800 described earlier in connection with FIG. 8.

The active load structure 900 includes a resistance $R_L$ 902, an NMOS device 904, and a capacitance $C_{GS}$ 906. An input voltage (VBP) 908 biases the active load structure 900. In one embodiment, this input voltage (VBP) 908 is generated using the process compensation structure described in greater detail later in connection with FIGS. 16-18. A parasitic capacitance $C_P$ 910 on the output corresponds to a composite of device and wiring loads on the specific buffer. These components combine to create a loading structure that is used in the actively-peaked CML logic family.

In one embodiment, the resistance $R_L$ 902 corresponds to a polysilicon resistor; however, other resistive elements could be used to provide similar benefits. In one embodiment, the capacitance $C_{GS}$ 906 corresponds simply to the parasitic capacitance that is associated with the NMOS device 904. However, in many applications it may be preferred that an explicit capacitance be added from the gate to the source of the NMOS device 904 in order to further enhance performance. The cell can be approximately modeled or analyzed using ideal components. In order to understand the benefits of the active load structure 900, one may analyze the small-signal equivalent model of the active load structure 900.

Figure 10:
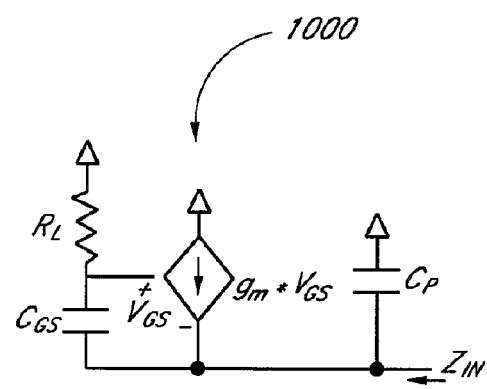
FIG. 10 illustrates a small-signal AC model of the NMOS active load.

FIG. 10 illustrates the small-signal equivalent model 1000 of the active load structure 900 described in FIG. 9. For clarity, this small-signal equivalent model is simplified to illustrate selected parameters for the analysis.

Reduction of the circuit in the Laplace frequency domain results in an output impedance that is summarized by Equation 4. See Ronald E. Thomas and Albert J. Rosa, *The Analysis and Design of Linear Circuits*, Chapter 10, Englewood Cliffs, N.J.: Prentice Hall, 1994.

$$Z_{in} = \frac{1 + R_L C_{GS} s}{R_L C_{GS} C_P s^2 + (C_{GS} + C_P) s + gm} \quad \text{Equation 4}$$

Figure 11:
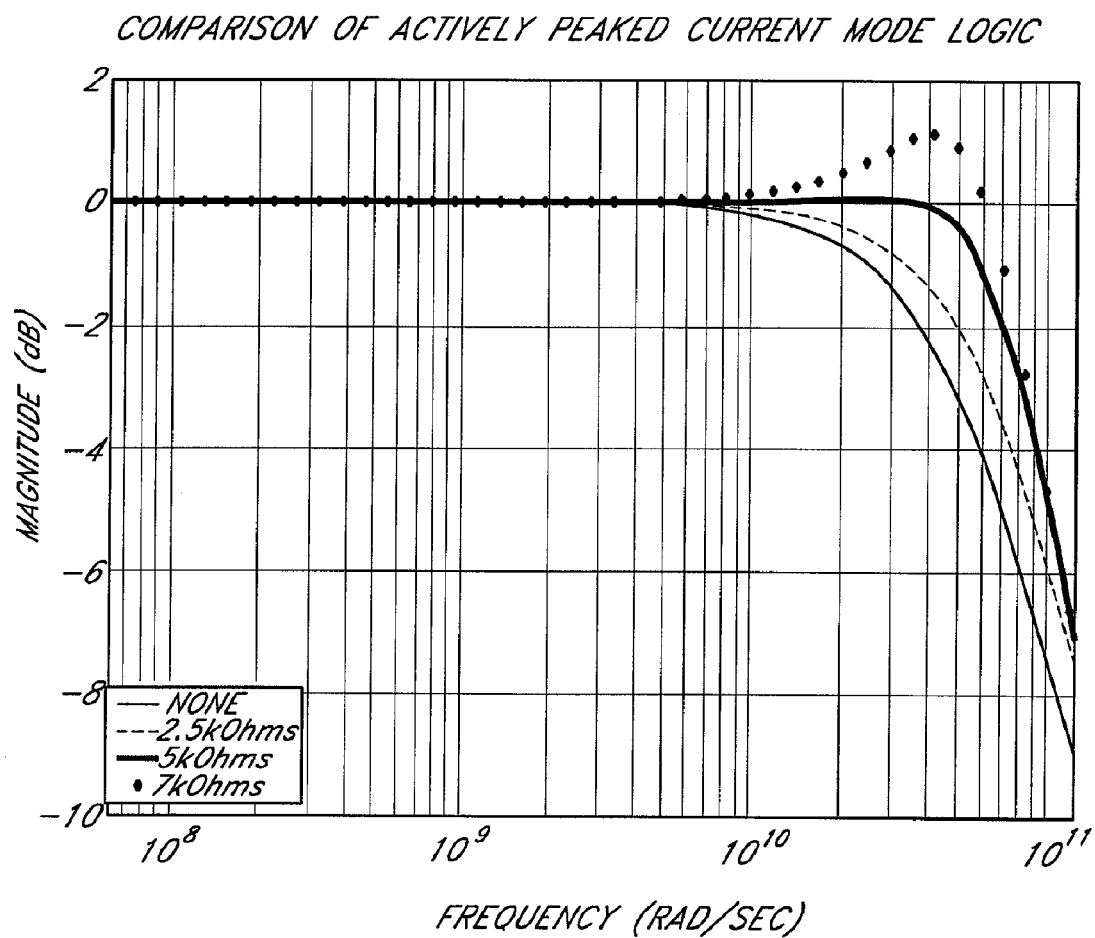
FIG. 11 illustrates a normalized magnitude response with varying values of load resistance.

FIG. 11 illustrates the normalized magnitude response of this type of load with different values of resistance, $R_L$, as compared to a standard resistive load. The figure illustrates the improvement in frequency response. The output impedance is peaked and drops off at a much higher frequency. This frequency improvement results in smaller propagation delays and an increase in maximum operating frequency of the structures.

At relatively low frequencies, the output impedance ($Z_{LF}$) of the load is expressed by Equation 5. This equation can be used to analyze the operation of the buffer described in connection with FIG. 8.

$$Z_{LF} = \frac{1}{gm} \quad \text{Equation 5}$$

When the area consumed by a load is compared to conventional techniques of using an inductor to create an improved response, the area of an NMOS active load is advantageously significantly smaller. This is due to the fact that inductor implementations are significantly larger in silicon area than the NMOS device that is used to perform a similar speed improvement.

Advantageously, this type of load provides for relatively high frequency operation from a relatively small area. The operating frequency is improved by the peaking provided by the NMOS load structure. The area is advantageously reduced from a typical implementation of an inductively peaked approach.

Logic Buffer

Further benefits of the NMOS active load can be apparent respect to the design and optimization of the logic buffer 800. The logic buffer 800 is one of the most simple of the logic structures to analyze and this analysis can then be applied to the other types of logic cells.

FIG. 8 illustrates one embodiment of a structure for the actively-peaked current mode logic buffer 800. The logic buffer 800 includes a current source 802 with current value $I_{tail}$, a differential pair of transistors, $M_P$ 804 and $M_N$ 806, and the active load structure 808, 810, 812, 814 described earlier in connection with FIG. 9. In one embodiment, the tail current source 802 is an NMOS transistor.

The logic buffer 800 does not perform a logical operation on the incoming data. A logic "1" is denoted by a positive voltage difference between inputs ($I_P$-$I_N$). A logic "0" is denoted by a negative voltage difference between inputs ($I_P$-$I_N$). When the buffer receives a logic "1" it outputs a logic "1." Similarly, when the buffer receives a logic "0" it outputs a logic "0." It will be understood that with differential logic, such as that used in the logic buffer 800, the inverse of a signal can be obtained by swapping true and false (complementary) or positive and negative inputs and/or outputs.

In one embodiment, optimizing the logic buffer 800 includes reducing the output capacitance $C_P$ 910 while maintaining sufficient gain. In order to maintain sufficient signal amplitude, the gain of the cell should remain higher than unity for process, voltage and temperature shifts that are standard in a production CMOS part.

From the analysis performed on the NMOS active load structure 900, Equation 5 indicates that the low frequency small signal output admittance of the load corresponds to the $g_m$ of the device load ($g_{mL}$). The gain of the cell is defined by the multiplication of the differential pair gain ($g_{mD}$) by the output impedance of the load. The gain of the cell can be expressed with Equation 6.

$$\text{Gain} = \frac{gm_D}{gm_L} \quad \text{Equation 6}$$

In a typical CMOS process, the variation of $g_m$ of two NMOS transistors is relatively closely correlated over process, voltage, and temperature. Accordingly, the gain of this cell, which corresponds approximately to a ratio of gains between NMOS transistors, should be relatively constant over process voltage and temperature.

Conventional devices relies on the ratio of two uncorrelated parameters, for example polysilicon resistor sheet resistance for the resistance and NMOS device parameters the $g_m$ of the devices. The NMOS loads 808, 810, 812, 814, provide a significant advantage over conventional techniques since the gain variation is dramatically reduced over conventional techniques.

In one embodiment, the appropriate optimization of the logic buffer 800 includes a reduction in the output parasitic capacitance as much as possible. A large contributor to this output capacitance is the load of the drains of the transistors $M_P$ 804 and $M_N$ 806 for the differential pair from FIG. 8. In order to reduce that drain capacitance, the size of the devices can be reduced. However, a result of this modification is that the gain of the overall cell drops. Since the gain of the cell should remain above unity over process, voltage and temperature variations, it can be difficult to reduce the size of the differential pair too much if the variation of the gain is significant. The active loads provide a significant benefit in reduction of parasitic capacitance, and the gain of a buffer using these cells advantageously remains relatively constant.

Logic Family

The use of these active loads can advantageously be applied to an entire family of logic cells. For example, these cells can include an "AND" gate, an "OR" gate, a Multiplexer (mux) circuit, a latch and a flip-flop. The combination of these cells can be used to create high-speed logic functions.

Figure 12:
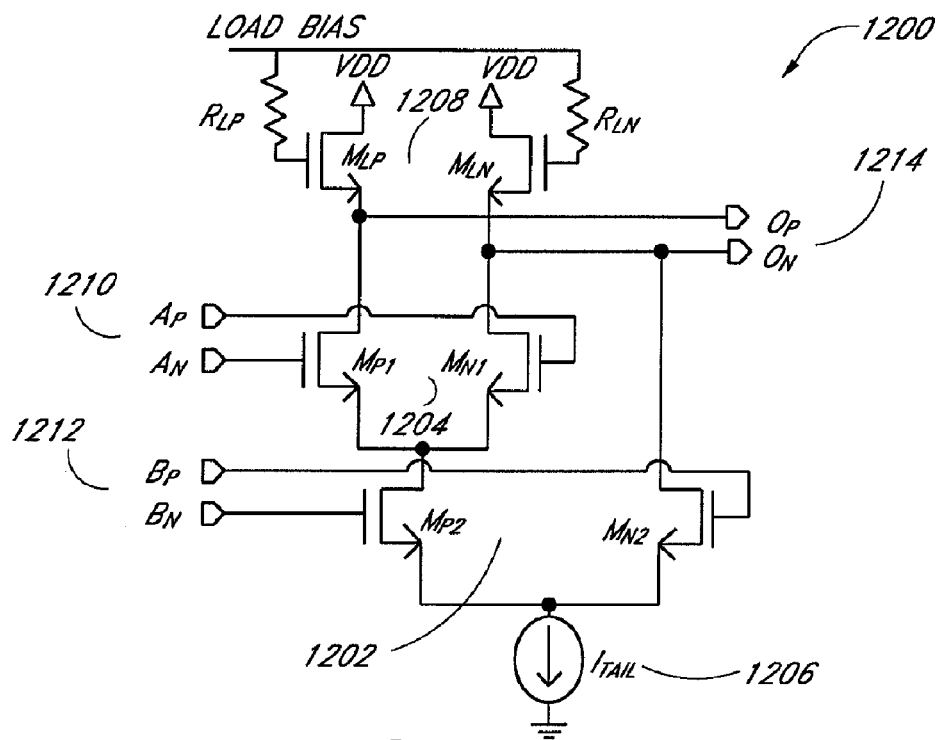
FIG. 12 illustrates one embodiment of an actively-peaked "OR" cell.

One embodiment of an "OR" logic cell 1200 is illustrated in FIG. 12. The illustrated "OR" logic cell 1200 includes two differential pairs 1202, 1204, a current source 1206, and an active load 1208. The "OR" logic cell 1200 performs a logical "OR" function. When either inputs "A" 1210 or "B" 1212 are logic "1", the "OR" logic cell 1200 outputs 1214 a logic "1."

An "AND" logic cell can advantageously be configured from the "OR" logic cell 1200 illustrated in FIG. 12 by application of De Morgan's Equivalence Theorem. In one embodiment, the "AND" logic cell corresponds to the "OR" logic cell 1200 with inputs $A_P$ swapped with $A_N$, $B_P$ swapped with $B_N$, and $O_P$ swapped with $O_N$. The "AND" logic cell performs the "AND" logic function. In an "AND" logic cell, when both inputs ("A" and "B") are logic "1" the AND cell outputs a logic "1." Any other combination of logic inputs results in an output of a logic "0." It will be understood by one of ordinary skill in the art that interchanging the outputs of a differential logic cell inverts the output, such that a NOR cell can be generated by interchanging the outputs of an "OR" cell, and that a "NAND" cell can be generated by interchanging the outputs of an "AND" cell.

Figure 13:
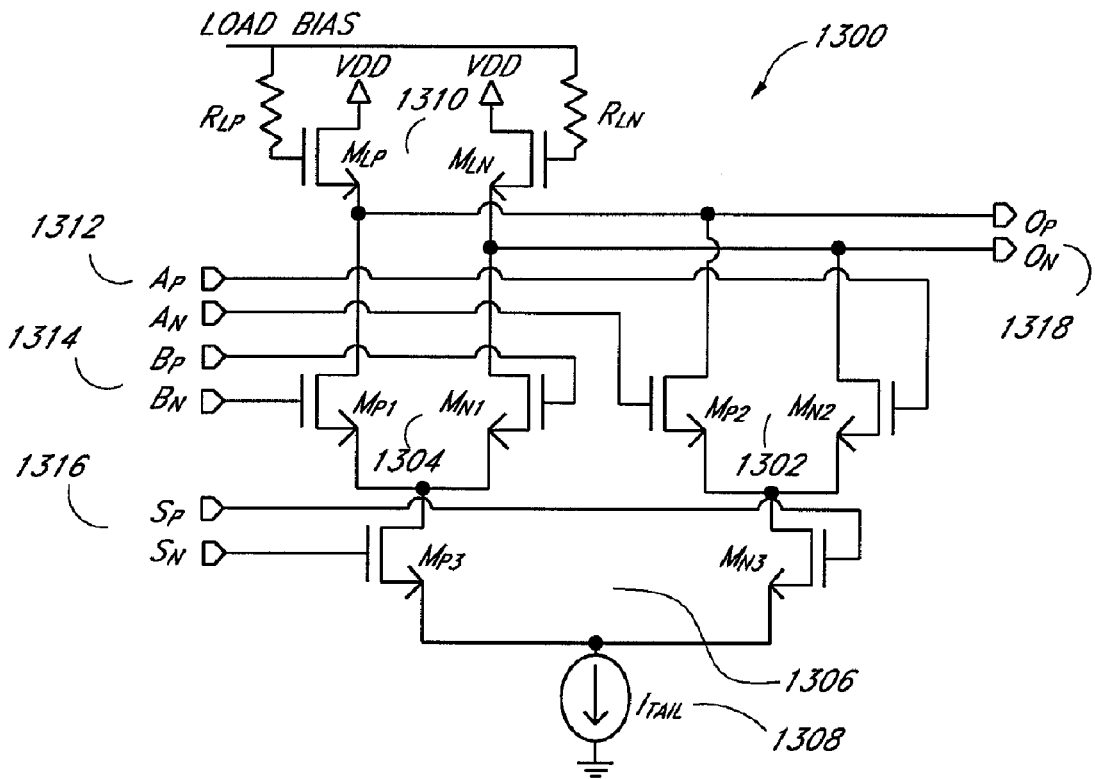
FIG. 13 illustrates one embodiment of an actively-peaked multiplexer or MUX.

FIG. 13 illustrates one embodiment of a "mux" logic cell 1300. The illustrated mux logic cell 1300 includes three differential pairs 1302, 1304, 1306, a current source 1308, and an active load 1310. The mux logic cell 1300 selects between the two inputs "A" 1312 or "B" 1314 at least partly in response to the select "S" input 1316. When the "S" input 1316 is logic "1", the "A" input is selected and the logic value of A is provided as an output to the output "O" 1318. When the "S" input 1316 is logic "0", the mux logic cell 1300 provides the logic value of the "B" input 1314 as the output "O" 1318.

Figure 14:
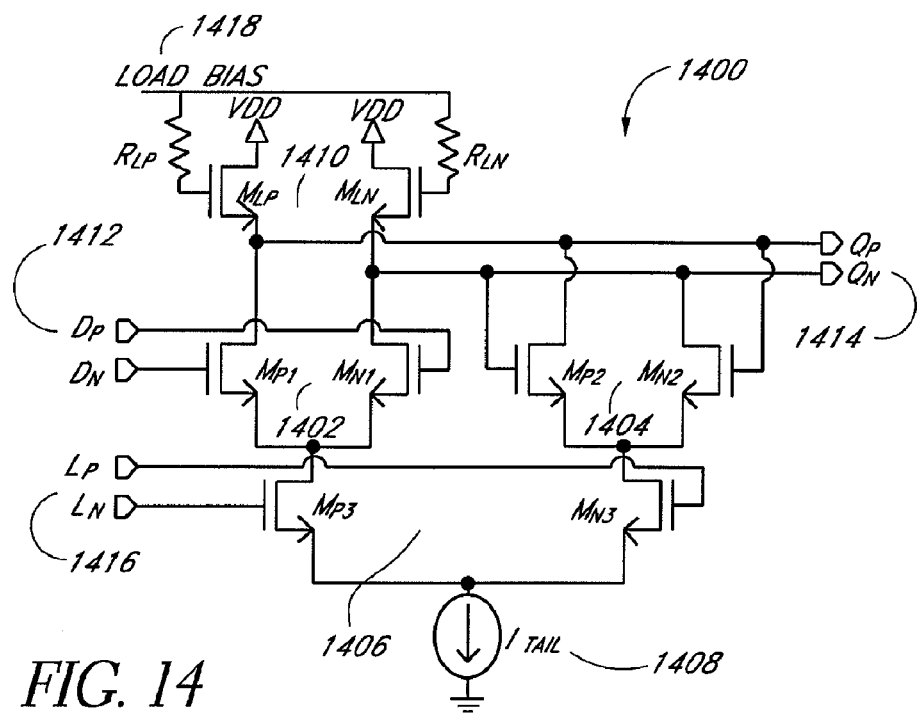
FIG. 14 illustrates one embodiment of an actively-peaked latch cell.

FIG. 14 illustrates one embodiment of a "latch" cell 1400. In one embodiment, the latch cell 1400 corresponds to a configuration of the mux logic cell 1300 with the "A" input 1312 coupled to the output "O" 1318. The illustrated latch cell 1400 includes three differential pairs 1402, 1404, 1406, a current source 1408, and an active load 1410. In the illustrated latch cell 1400, the differential pair circuit $M_{P1}$ and $M_{N1}$ 1402 is coupled to the input "D" 1412. The second differential pair circuit $M_{P2}$ and $M_{N2}$ 1404 is coupled to the output "Q" 1414. This differential pair 1404 is used to create a positive feedback path to hold the incoming signal when these transistors are selected. The third differential pair circuit $M_{P3}$ and $M_{N3}$ 1406 is used to switch the current between the other two differential pairs 1402, 1406. The latch cell 1400 is capable of holding the input value for a period of time. The latch cell 1400 allows the data to pass from the input "D" 1412 to the output "Q" 1414 while the latch select input "L" 1416 is logic "0." While the latch select input "L" 1416 is high or logic "1", the logic value that present on the input "D" 1412 approximately at the time the latch select input "L" 1416 changed from logic "0" to logic "1" remains on the output "Q" 1414 at least until the latch input "D" 1412 is set to logic "0." A load bias 1418 is provided to the active load 1410 of the latch cell 1400.

Figure 15:
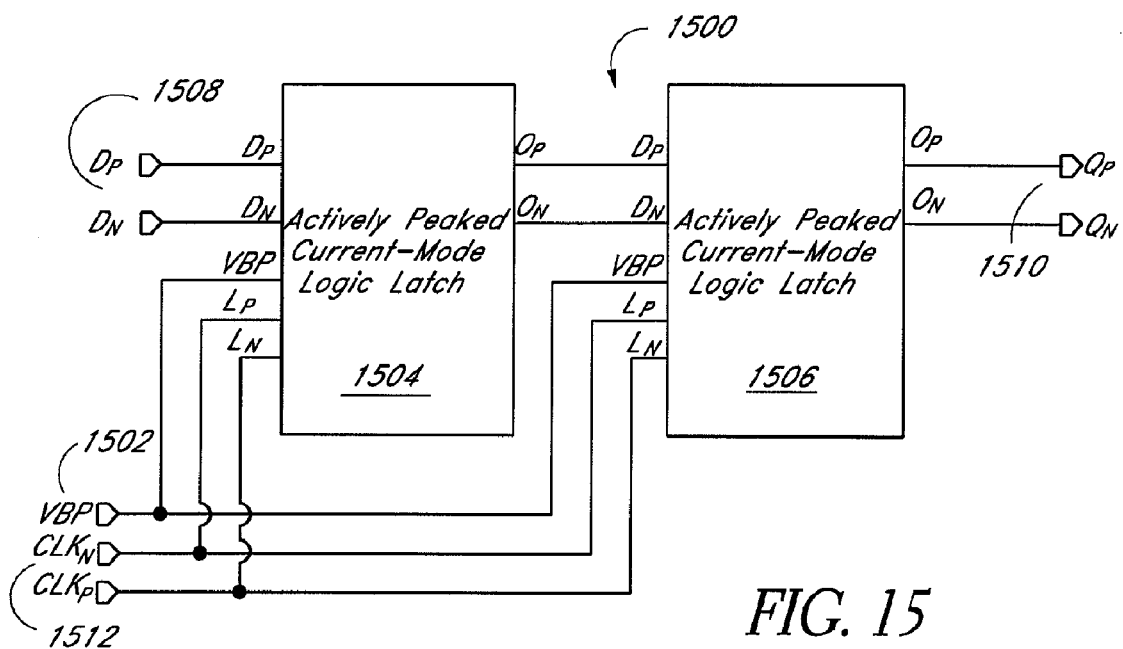
FIG. 15 illustrates one embodiment of an actively-peaked D-type flip-flop.

FIG. 15 illustrates one embodiment of a D-type flip-flop (D-FF) cell 1500. In the illustrated D-FF cell 1500, a bias VBP 1502 corresponds to a load bias voltage, such as the load bias 1418 that is provided as an input to the active load 1410 of the latch cell 1400 described earlier in connection with FIG. 14. In one embodiment, the D-FF cell 1500 is configured from two latch cells 1504, 1506 coupled in series. For example, the two latch cells 1504, 1506 can correspond to the latch cell 1400. The D-FF cell 1500 stores data from input (I) "D" 1508 to output (O) "Q" 1510 and holds the value on the positive edge of an incoming clock signal CLK 1512. In the illustrated D-FF, the positive edge of the clock signal CLK 1512 is defined as the transition from logic "0" to logic "1." For example, the D-FF cell 1500 can advantageously be used in synchronous registers to store information for a period of a clock cycle.

Active Peaking Bias

The active load structure described earlier in connection with FIGS. 8-15 should be properly biased. There exist a number of large signal and process variations that can require special compensation. This special compensation is preferably performed through the biasing of the input to the resistor on the gate of the NMOS load, and is illustrated in FIG. 8 as a load bias 816, in FIG. 9 as the VBP Bias 908, in FIGS. 12-14 as a load bias, and in FIG. 15 as the bias VBP 1502.

Compensation is preferably provided to address a number of issues. For example, the logic cells can operate inefficiently in response to large signals. In another example, there can be process variations with the resistors ($R_{LP}$, $R_{LN}$) and the NMOS load transistors ($M_{LP}$, $M_{LN}$) that can cause undesirable variations in peaking. In another example, the bottom differential pair on a logic cell that has stacked differential pairs can have specific issues that cause poor functionality over process. Biasing can correctly compensate for these potential issues.

The large signal issues with the active load devices arise from the fact that the load impedance is dependent on its small-signal gain ($g_m$). Disadvantageously, this admittance ($g_m$) can decrease with smaller currents through the device.

Figure 16:
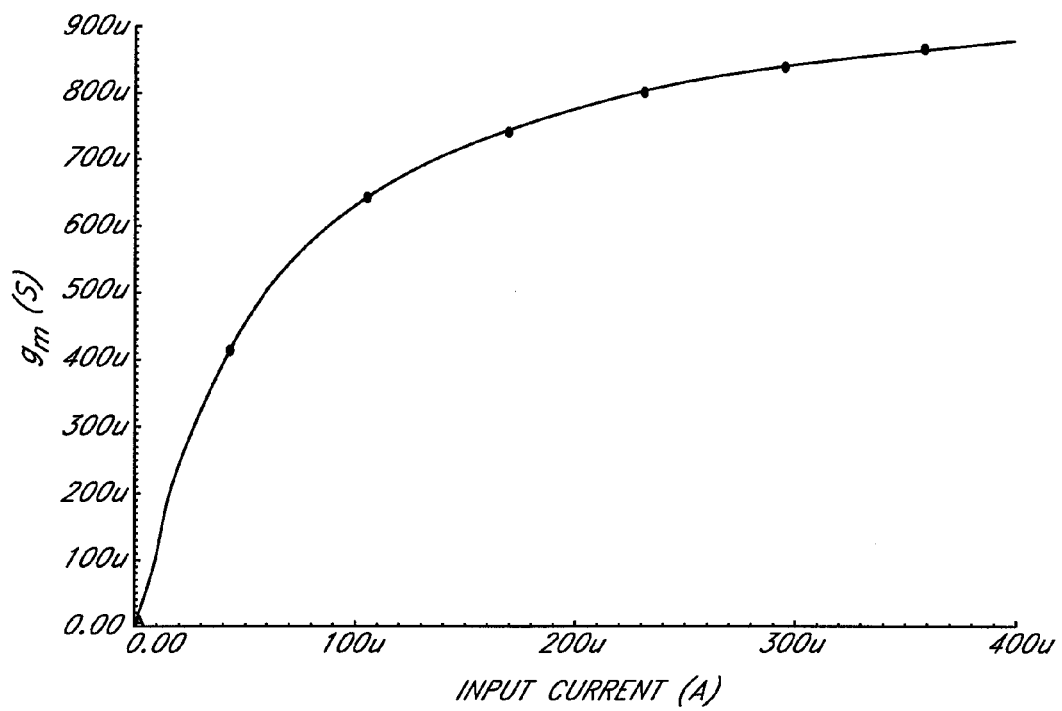
FIG. 16 illustrates an example of load device admittance ($g_m$) over various current levels.

FIG. 16 illustrates a plot of the admittance ($g_m$) of the device over varying current levels. The smaller admittance with lower current levels means that as the output voltage goes higher, the impedance increases. Since the speed of the output is dependant on the impedance, the higher the output voltage, the slower the rise of the output.

The amount of peaking can vary in response to process variations. This variation can be due to a number of factors. The position of the peaking depends on the values of the peaking resistor R, the gate source capacitance $C_{GS}$, the $g_m$ of the load device and the parasitic output capacitance $C_P$. An uncompensated load can exhibit relatively large variation in the amount of peaking over process corners.

In one process corner, where the $g_m$ is relatively large and pushes the bandwidth out to a higher frequency; however, this means the process can over compensate and can result in an undesirable effect of varying delays depending on the data pattern through the buffer. Similarly, in the opposite process corner, where the $g_m$ is relatively small thereby making the bandwidth smaller than desired. This can reduce the amount of peaking so that the active load can be slower than expected or desired.

Appropriate biasing of the NMOS load can reduce these two undesirable effects. To mitigate the impedance variations of the load, the bias for the device should be set so that the NMOS device enters the triode region as the impedance increases. The NMOS device operating in the triode region has a significantly lower drain to source impedance and effectively lowers the overall impedance of the load.

Further, the process corner variation can be improved by taking advantage of the negative effects of the large signals. For example, by placing the device in triode at a smaller input current when the $g_m$ is small, the transitions can be sped up. Similarly, the load device can be placed into triode with a larger input current when the $g_m$ is large.

The resistor variation of the load resistor ($R_L$) can have a significant impact on overall performance as well. It is desirable to compensate for these effects by selecting the placement of the triode region/saturation region crossover with proper biasing. In this situation, when the load resistor is relatively small, the amount of peaking can be relatively smaller, so that the NMOS load device ($M_L$) is placed into triode at a relatively smaller drain current. When the value of the load resistor is relatively large, the amount of peaking can be larger, so that the NMOS load device is placed into triode at a larger drain current.

A third potential issue is related to logic cells that have multiple levels of differential pairs. These cells include the "AND" cell, "OR" cell, "mux" cell, latch cell, flip-flop cell, and the like. If the input signals for the lower differential pair, for example, $M_{P3}$ and $M_{N3}$ 1306 in the mux logic cell 1300 of FIG. 13, have the same voltage bias levels as an upper differential pair, for example, $M_{P2}$ and $M_{N2}$ 1302 in the mux logic cell 1300, the lower differential pair can be forced into triode while switching. This causes an undesirable reduction in gain of the lower differential pair.

When the gain in the lower differential pair is reduced, less than all the current is typically switched to the desired path. The remaining current, normally called "leakage," can increase pattern dependant jitter, cause a reduction in noise margin in latches and flip-flops, and, in some cases, cause a latch to lose the value for data to be held. This common problem with CML has a relatively simple fix when using NMOS active loads.

This reduction in differential pair gain can be reduced by lowering the voltage levels of the signals to the lower differential pair of the mux logic cell 1300 or other logic cell with multiple levels of differential pairs. In one embodiment, to reduce the levels of the differential pairs, a lower level bias can be supplied to the NMOS load bias for the buffer driving those differential pairs. This lower bias level shifts the common mode of the differential pair such that the devices are no longer are forced into triode during operation.

Figure 17:
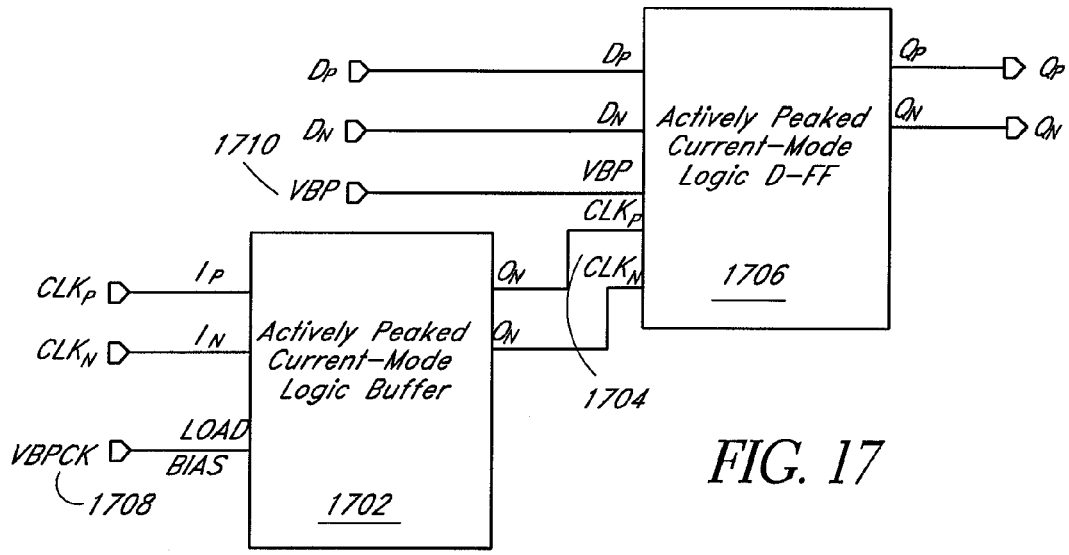
FIG. 17 illustrates one embodiment of logic-level shifting for actively-peaked current mode logic.

FIG. 17 illustrates an example usage of the level correction. In this example, a buffer 1702 drives the clock inputs 1704 to a D-type flip-flop 1706. The clock inputs 1704 to the D-type flip-flop 1706 are level shifted using the special bias VBPCK 1708 that supplies the load bias input to the buffer 1702. The special bias VBPCK 1708 is a lower voltage potential than the load bias VBP 1710 supplied to the D-type flip-flop 1706. The clock inputs 1704, which would conventionally be voltage levels of a typical regular bias, are shifted down because of the lower voltage on the special bias VBPCK 1708. This is one example of an implementation of the level shift.

Figure 18:
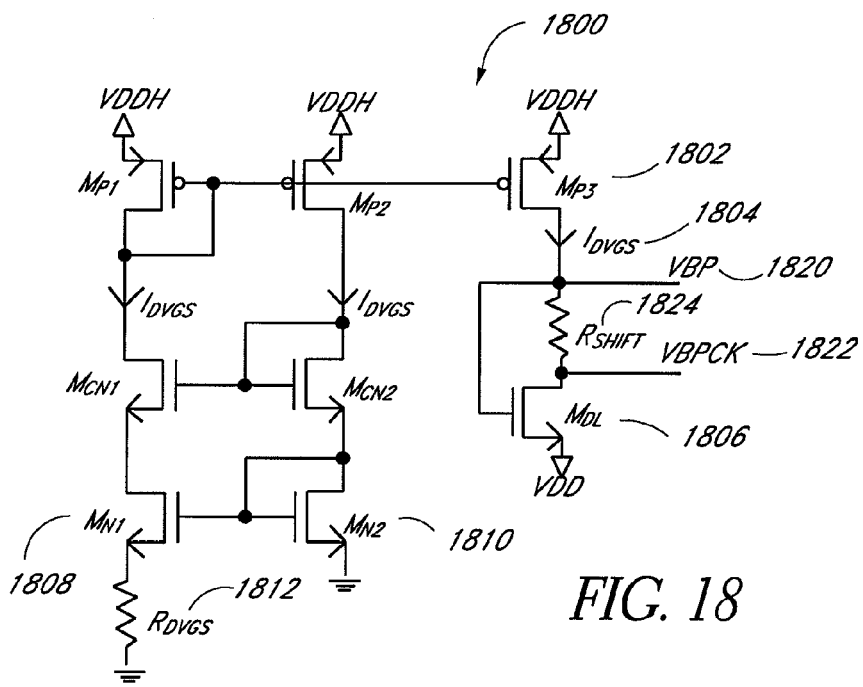
FIG. 18 illustrates one embodiment of a circuit for active peaking bias.

These performance enhancements can advantageously be combined into one bias circuit as illustrated in FIG. 18. FIG. 18 illustrates one embodiment of such a bias circuit 1800.

The illustrated bias circuit 1800 includes a standard delta-$V_{GS}$ (constant $g_m$) bias 1802 whose output current $I_{DVGS}$ 1804 is mirrored to a diode connected device $M_{DL}$ 1806 that has proportional dimensions to the NMOS in the load bias. The delta-$V_{GS}$ 1802 outputs a current $I_{DVGS}$ 1804, assuming the ratio of width to length for device $M_{N1}$ ($D_1$) 1808 is about four times that of $M_{N2}$ 1810, is summarized by Equation 7. David A. Johns and Ken Martin, Analog Integrated Circuit Design, Chapter 5, pages 248-251, New York, N.Y.: Johns Wiley & Sons, Inc., 1997.

$$I_{DVGS} = \frac{1}{2\mu_n C_{OX} D_1 R_{DVGS}^2}$$ Equation 7

Note that the proportionality to the resistance $R_{DVGS}$ 1812 in the bias current $I_{DVGS}$ 1804. This proportionality is important to compensate for process variations of the resistor in the NMOS load. For large values of resistance in the load, the current can decrease and thereby lower VBP output voltage 1820. This event, in turn, causes the load device to go into the triode region of operation at larger currents and operate slower. Since a relatively larger resistor in the load results in larger amounts of peaking, these two effects at least partially cancel each other out. This improves overall process variations on the amount of peaking in the device.

Although FIG. 18 illustrates one implementation of a delta-$V_{GS}$ bias, the skilled practitioner will appreciate that there are many possible implementations of a constant $g_m$ bias that result in the same or similar overall effect.

To generate the VBPCK voltage 1822, the bias current $I_{DVGS}$ 1804 is driven to a resistor $R_{SHIFT}$ 1824 and to a diode connected device $M_{DL}$ 1806. The resistor $R_{SHIFT}$ 1824 is used to create the level shifted voltage (VBPCK) 1822 used to bias the level shift for the buffers that drive the lower differential pairs of latches, muxes, "AND" cells and "OR" cells.

Implementation with Other Logic Families

The previous sections described speed improvements. This speed comes at the cost of power. The current mode logic family uses a constant DC current bias so that the power typically does not proportionally decrease with speed. For lower power consumption, it can be desirable to lower the operating speed of the data to rates that other logic families, such as standard CMOS logic, will be able to handle.

Figure 19:
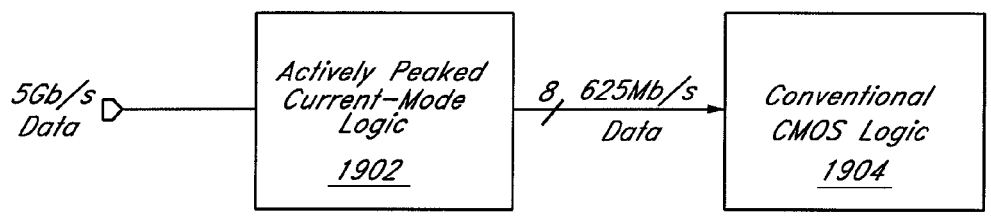
FIG. 19 illustrates one embodiment of integration of active load current-mode logic with lower-speed logic.

Both operating speeds and integration levels can be increased or maximized by providing enhanced performance using active load current-mode logic in conjunction with CMOS logic that operate at lower speeds and with higher integration levels. FIG. 19 illustrates one embodiment of such a circuit.

FIG. 19 illustrates an embodiment of a circuit in which data from a higher speed current-mode logic circuit with active peaking 1902 is passed to a lower speed conventional CMOS circuit 1904. For example, the higher speed current-mode logic circuit with active peaking 1902 can include demultiplexing functions. In the illustrated embodiment, the speed of the incoming data is 5 Gb/s and is reduced to 8 lines at 625 Mb/s so that the data can advantageously be processed with conventional CMOS logic. Other ratios will be readily determined by one of ordinary skill in the art.

Figure 20:
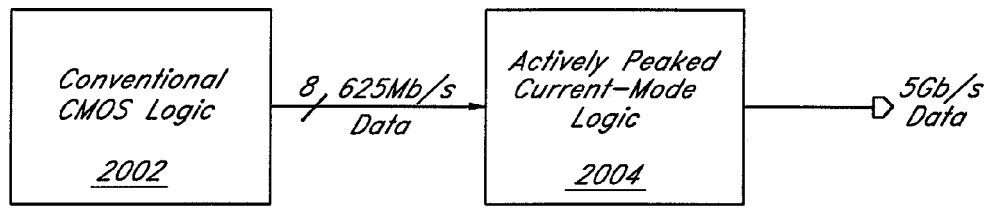
FIG. 20 illustrates one embodiment of integration of lower-speed logic with active load current-mode logic.

It can also be desirable to go from lower speed logic 2002 to higher speed current-mode logic 2004 with active peaking. FIG. 20 illustrates an example of an implementation of lower speed logic to higher speed logic. In the illustrated embodiment, an 8-bit wide 625 Mb/s bus is reduced to a single 5 Gb/s bus for processing at higher data rates. Other ratios will be readily determined by one of ordinary skill in the art.

Figure 21:
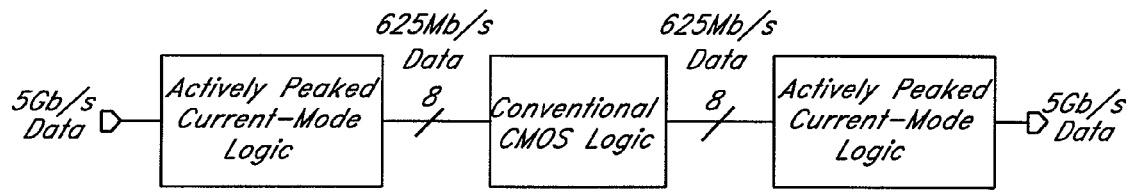
FIG. 21 illustrates one embodiment of integration of an active load current-mode logic circuit to process higher data rate bit streams to lower data rate bit streams, processing data with logic, and reprocessing the data to a higher data rate bit stream with another active load current-mode circuit.

The above techniques can be combined into one high performance datapath the has both a high data rate incoming bit stream, high density, low power conventional CMOS processing and a high data rate outgoing bit stream. FIG. 21 shows the combination of FIG. 19 and FIG. 20. It will be understood that the incoming data rate, the processing data rate, and the outgoing data rate can vary in a very broad range and that the incoming data rate and the outgoing data rate can vary in speed and in width or can be the same.

Enhancements

The active peaking circuits described earlier in connection with FIGS. 8-21 represent illustrative embodiments. There are a number of further enhancements to the design of the circuitry that have specific advantages. This section details these enhancements.

Advanced Active Peaking Circuit

Figure 22:
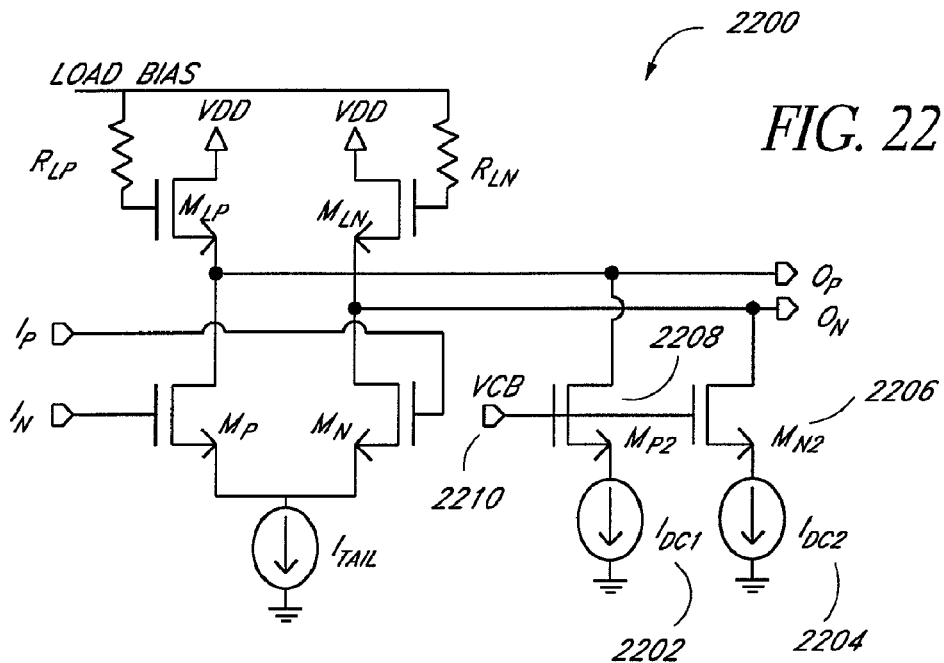
FIG. 22 illustrates one embodiment of an actively-peaked buffer with DC current sources applied to the load.

FIG. 22 illustrates one embodiment of an advanced active peaking circuit 2200. In order to further enhance the performance of the actively-peaked current-mode logic, a DC current can be supplied to the load. This DC current can advantageously be used to reduce the $g_m$ variations that can cause speed and performance issues.

The illustrated advanced active peaking circuit 2200 has two current sources $I_{DC1}$ 2202 and $I_{DC2}$ 2204, and two NMOS cascode devices $M_{N2}$ 2206 and $M_{P2}$ 2208. As used herein, the term "current source" can apply to both current sources and to current sinks. In one embodiment, the current source are embodied by a relatively large NMOS device in saturation. The cascode devices $M_{N2}$ 2206 and $M_{P2}$ 2208 are intended to be relatively smaller devices than the relatively large devices used in the current sources, such as the relatively large NMOS devices, so as to minimize output loading at relatively high frequencies due to a reduction in parasitic capacitance. The voltage VCB 2210 applied to the gates of the cascode transistors can vary in a very broad range. In one embodiment, the voltage VCB 2210 corresponds to a voltage that keeps the NMOS current source devices in saturation. In one embodiment, the voltage VCB 2210 corresponds to a bias tied directly to VDD.

The advanced active peaking circuit 2200 illustrated in FIG. 22 advantageously reduces overall $g_m$ variations by providing a relatively stable DC current to the loads. The improvement is due to the fact that the majority of the reduction in admittance ($g_m$) of the load devices occurs when the current through the devices is reduced significantly. By contributing a relatively small DC current, the devices can maintain a higher overall $g_m$ and operate with a larger overall admittance.

Figure 23:
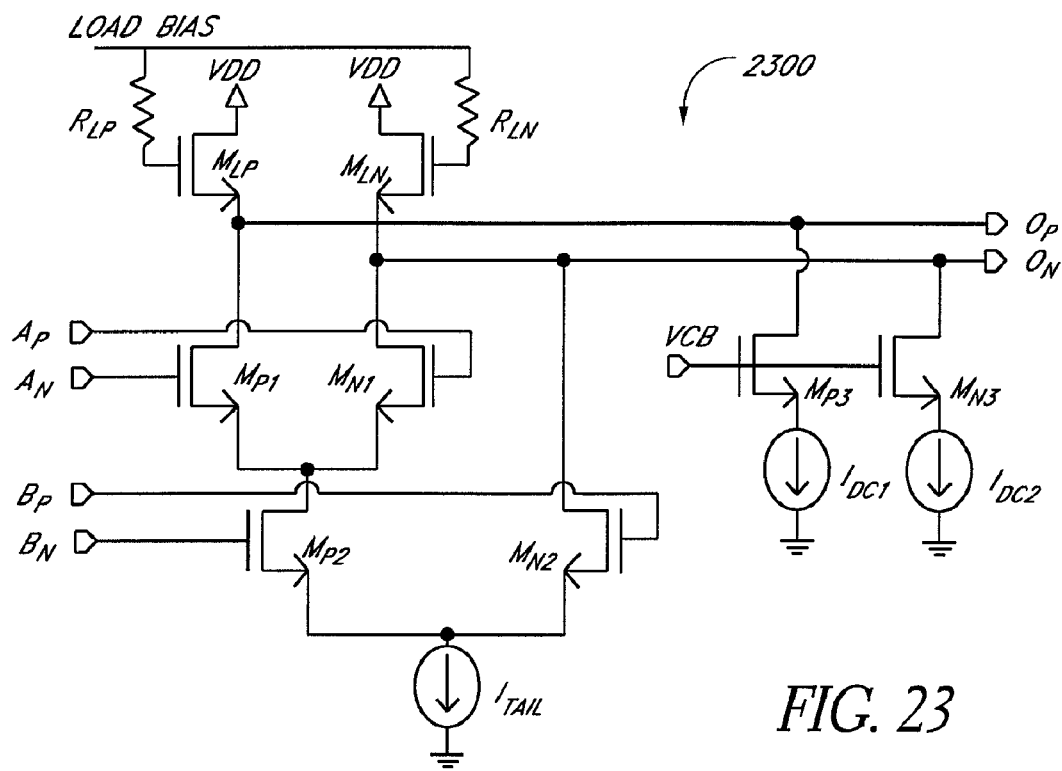
FIG. 23 illustrates one embodiment of an actively-peaked "OR" cell with DC current sources applied to the load.

This type of loading can be used with the logic cells described earlier in connection with FIGS. 12-15. To include this type of loading, corresponding cascode devices $M_{P2}$ 2208 and $M_{N2}$ 2206 and their associated current sources $I_{DC1}$ 2202 and $I_{DC2}$ 2204 can be provided on the outputs of the logic cell. For example, FIG. 23 illustrates the use of the advanced active load peaking with an "OR" gate 2300.

The illustrated added DC current has a drawback. The added DC current is not used for switching of the outputs and does not provide additional drive to the capacitive output load during the switching period. This means that the overall power of the logic cell can increase with the inclusion of the DC current with some improvements to speed but not as much as if the current were actually used on the load capacitance.

Further Buffer Enhancements

Figure 24:
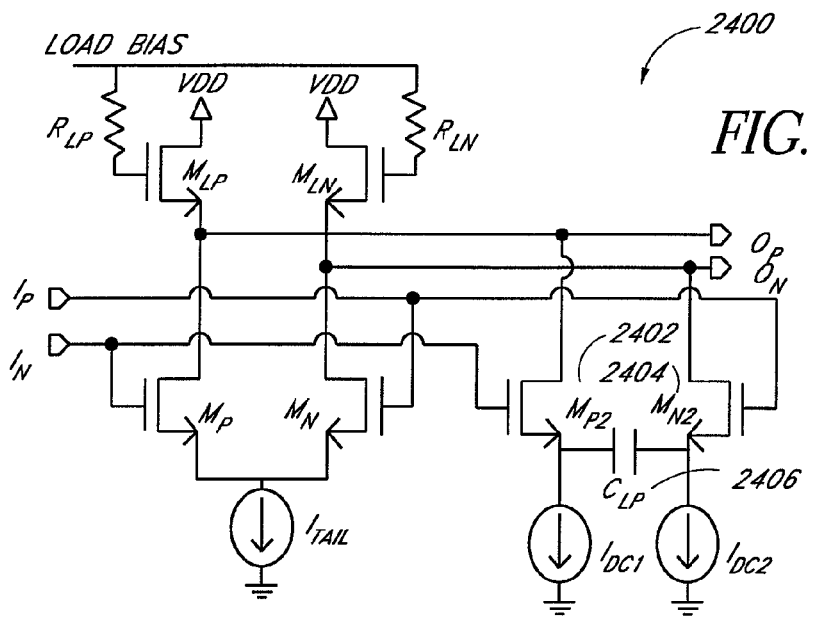
FIG. 24 illustrates one embodiment of an actively-peaked buffer with a peaking capacitor.

A further refinement further enhances the performance of the above embodiments by coupling the gates of the cascode devices to the input signal ($I_P$ and $I_N$) as illustrated in the buffer cell 2400 of FIG. 24. Connected between the sources of the NMOS cascode devices $M_{P2}$, $M_{N2}$ 2402, 2404 is a capacitor $C_{LP}$ 2406.

An incoming signal uses the charge stored on the differential capacitor $C_{LP}$ 2406 to advantageously charge the output load capacitor. The current used for the DC bias can advantageously be used to enhance overall performance of the cell.

The implementation of the capacitor can be both as the differential capacitor $C_{LP}$ 2406 as shown in FIG. 24 or can be two capacitors of twice the capacitance value coupled to a voltage reference, such as ground. The equivalence of capacitance values would be known to those skilled in the art.

In one embodiment, the coupling of the gates of the cascode devices to the input signal is used only for buffer cells and other cell types use the loading technique described earlier in connection with FIGS. 22 and 23.

Active Load using PMOS Device

Figure 25:
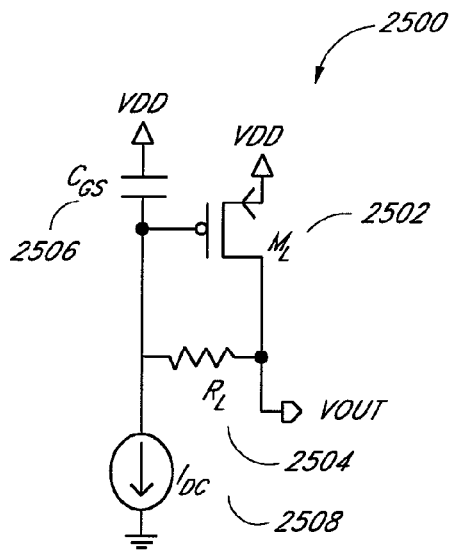
FIG. 25 illustrates one embodiment of a PMOS active load structure.

FIG. 25 illustrates one embodiment of a PMOS active load structure 2500. The PMOS active load structure 2500 uses a PMOS device instead of an NMOS device for the load. Advantageously, the PMOS active load structure can be configured to use relatively simple biasing.

The illustrated PMOS active load structure 2500 includes similar elements to the NMOS active load structure 900 described earlier in connection with FIG. 9. The illustrated PMOS active load structure 2500 includes a PMOS transistor $M_L$ 2502, a peaking resistor $R_L$ 2504, a capacitance $C_{GS}$ 2506, and a DC current source $I_{DC}$ 2508. The DC current source $I_{DC}$ 2508 supplies a bias to the gate of the PMOS transistor to reduce the output levels and increase output common mode. In one embodiment, the DC current source $I_{DC}$ 2508 is the only additional biasing used for the PMOS active load structure 2500. In one embodiment, the capacitance $C_{GS}$ 2506 corresponds to the parasitic capacitance of the PMOS transistor $M_L$ 2502 from gate to source. In another embodiment, the capacitance $C_{GS}$ 2506 further includes an explicit capacitance.

In one embodiment, process variations for the DC current source $I_{DC}$ 2508 are controlled to emulate the process compensation in the bias of the NMOS loads. This advantageously provides process compensation for the PMOS active load structure 2500. This functionality includes the capability of level shift, which can be implemented by increasing the amount of current through the load.

Figure 26:
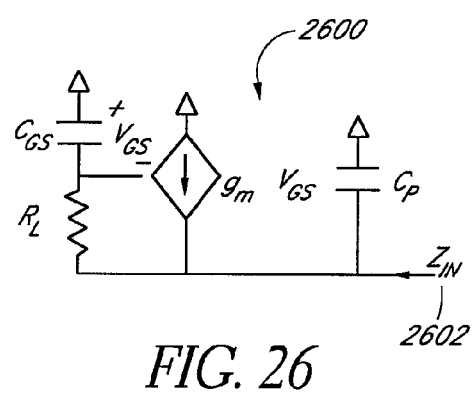
FIG. 26 illustrates a small-signal AC model of the PMOS active load.

FIG. 26 illustrates a small-signal AC model 2600 of the PMOS active load structure 2500. The behavior of the small-signal AC model 2600 can be modeled to represent an approximation of the small signal output impedance. The output impedance $Z_{in}$ 2602 can be represented in the Laplace frequency domain by Equation 8. See Ronald E. Thomas and Albert J. Rosa, *The Analysis and Design of Linear Circuits*, Chapter 10. Englewood Cliffs, N.J.: Prentice Hall, 1994.

$$Z_{in} = \frac{1 + R_L C_{GS} s}{R_L C_{GS} C_P s^2 + (C_{GS} + C_P)s + gm} \qquad \text{Equation 8}$$

The output impedance $Z_{in}$ 2602 approximately expressed by Equation 8 for the PMOS active load structure 2500 is the same expression as the output impedance that characterizes the NMOS type of load as described earlier in connection with Equation 4. It will be apparent to one of ordinary skill in the art that the PMOS active load structure 2500 represents just one embodiment out of many possible variations. Advantageously, the illustrated PMOS active load structure 2500 does not require any external biasing voltages since it is a self-biased circuit.

Figure 27:
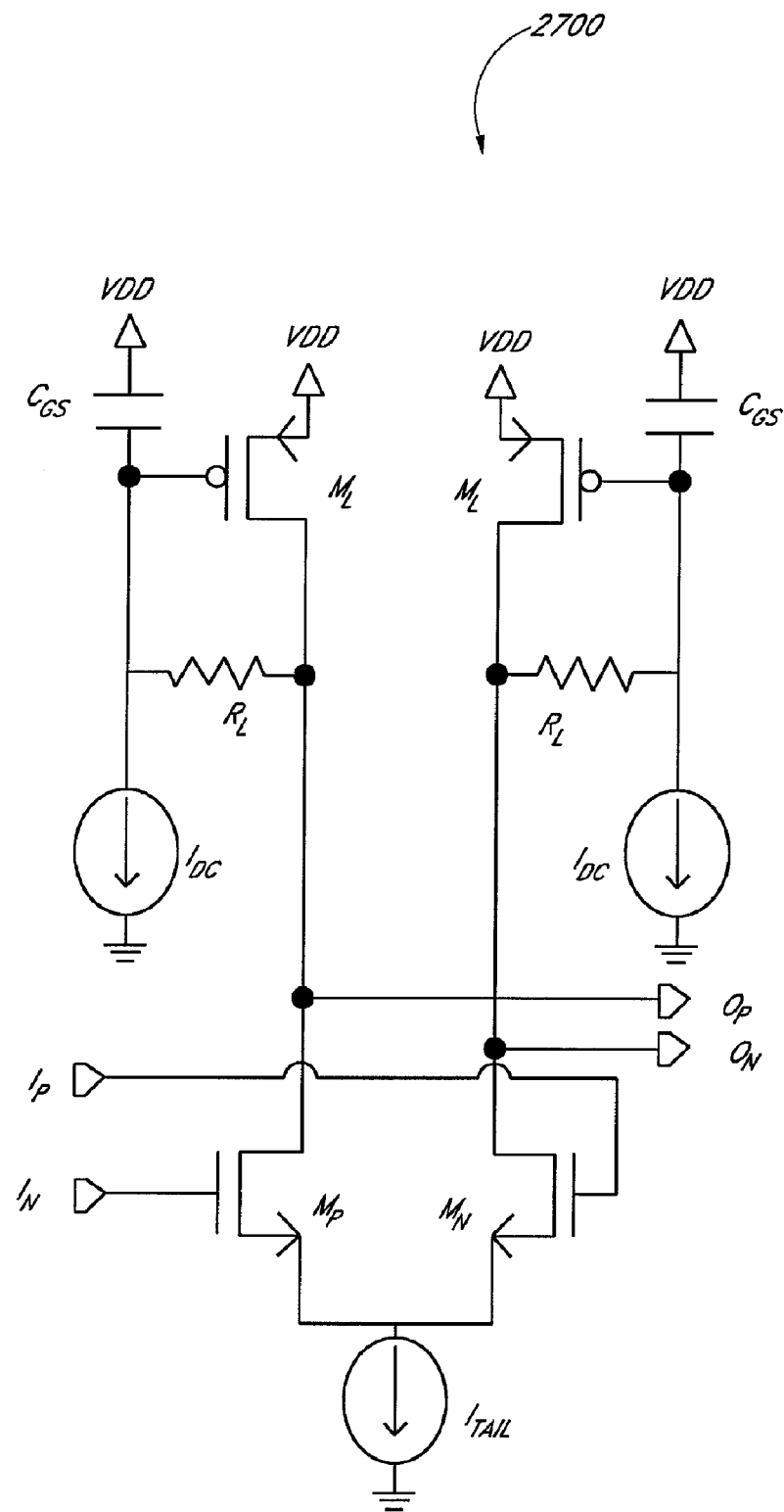
FIG. 27 illustrates one embodiment of an actively-peaked buffer with a PMOS active load.

The PMOS active load structure 2500 can replace the NMOS active load structure 900 described earlier in connection with FIG. 9 in the logic cells described earlier in connection with FIGS. 12-15 and the logic buffer described earlier in connection with FIG. 8. For example, FIG. 27 illustrates an embodiment of a logic buffer 2700 using the PMOS active load structure 2500.

In addition, the PMOS active load structure 2500 can optionally be used in combination with the DC current biases 2202, 2204 described earlier in connection with FIGS. 22-23 and/or can optionally be used with the differential or degeneration capacitor $C_{LP}$ 2406 described earlier in connection with FIG. 24.

Built-in Latch Reset

Figure 28:
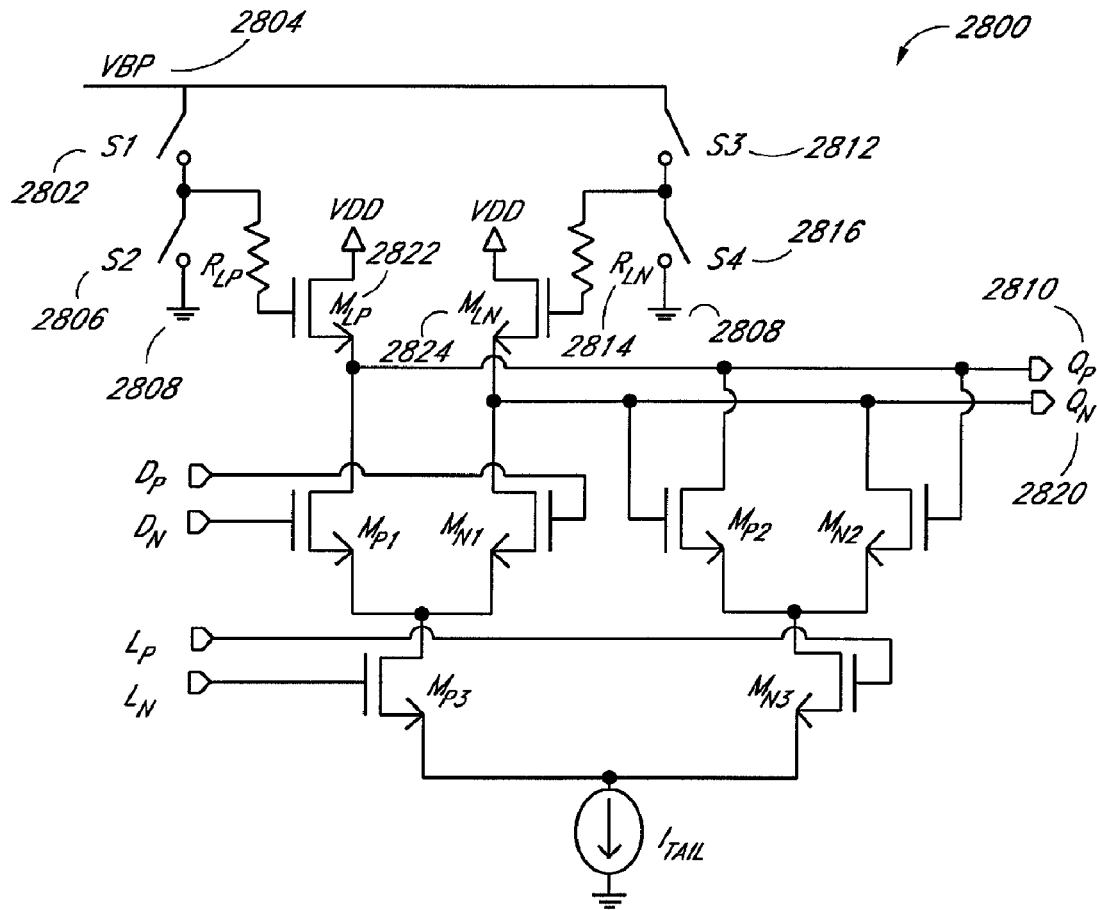
FIG. 28 illustrates one embodiment of an actively-peaked latch with a built-in reset.

FIG. 28 illustrates one embodiment of an actively-peaked latch with a built-in reset 2800. A further enhancement includes the use of the load bias for setting and/or resetting of the state of a latch. A desirable feature in many applications to be able to set the stored state of the output of a latch without any added speed impact to the latch itself. In conventional devices, most techniques used to reset the output of a latch are intrusive and degrade speed and performance of the latch. Advantageously, with the actively-peaked Current Mode Logic generally described herein, this feature of resetting the state of a latch can be added with little or no impact on performance of the corresponding circuit.

One embodiment providing this feature is illustrated in FIG. 28. In one embodiment, the actively-peaked latch with a built-in reset 2800 illustrated in FIG. 28 corresponds to the latch cell 1400 described earlier in connection with FIG. 14 with the addition of a switch S1 2802 on the load of the VBP bias 2804, a switch S2 2806 to ground 2808 for the positive side of the output $Q_P$ 2810, a switch S3 2812 from the VBP bias 2804 to the resistor 2814 and a switch S4 2816 to ground 2808 for the negative output $Q_N$ 2820. It will be understood by one of ordinary skill in the art that other suitable reference voltages can be used for ground 2808.

For normal operation of the illustrated latch 2800, the switches are configured as follows: the switch S1 2802 is closed, the switch S2 2806 is open, the switch S3 2812 is closed, and the switch S4 2816 is open. Under this condition, the bias line is provided externally from the VBP bias 2804. When the setting or resetting of the latch is desired, the switches are reconfigured. The configuration depends on whether the latch is to be set to a logic "1" state or is to be reset to a logic "0" state.

For setting of the illustrated latch 2800 to a logic "1" state, the switches are configured as follows: the switch S1 2802 is open, the switch S2 2806 is closed, the switch S3 2812 is closed, and the switch S4 2816 is open. Under this condition, the gate of the device $M_{LP}$ 2822 is pulled to ground 2808 and the gate of the device $M_{LN}$ 2824 is biased by the VBP bias 2804. When the gate of the device $M_{LP}$ 2822 is pulled to ground, the device $M_{LP}$ 2822 turns off, and the current flows through the device $M_{LN}$ 2824. Accordingly, the output $Q_P$ 2810 goes high and the negative output $Q_N$ 2820 goes low, thereby signifying a logic "1."

For resetting of the illustrated latch 2800 to a logic "0" state, the switches are configured as follows: the switch S1 2802 is closed, the switch S2 2806 is opened, the switch S3 2812 is opened, and the switch S4 2816 is closed. Under this condition, the gate of the device $M_{LN}$ 2824 is pulled to ground 2808, and the gate of the device $M_{LP}$ 2822 is biased by the VBP bias 2804. When the gate of the device $M_{LN}$ 2824 is pulled to ground 2808, the device $M_{LN}$ 2824 turns off, and the current flows through the device $M_{LP}$ 2822. Accordingly, the negative output $Q_N$ 2820 goes high, and the output $Q_P$ 2810 goes low, thereby signifying a logic "0" state.

In one embodiment, the switch S1 2802, the switch S2 2806, the switch S3 2812, and the switch S4 2816 are implemented with NMOS devices; however, the skilled practitioner will appreciate that the switches can be implemented in a myriad of other ways.

A combination of actively-peaked latches with a built-in reset can be used to implement a flip-flop with a built-in reset. The flip-flop can advantageously be reset asynchronously so that it can be reset independently of the state of the clock. For example, the latch 2800 illustrated in FIG. 28 can be substituted for one or both of the two latch cells 1504, 1506 of the D-FF cell 1500 described earlier in connection with FIG. 15 to produce a flip-flop that is advantageously settable and resettable.

This method of providing a set and reset provides a significant advantage over conventional techniques because it is advantageously relatively easy to implement and advantageously comes at little or no cost to speed and/or performance to the latch 2800.

Tuned Peaking

Figure 29:
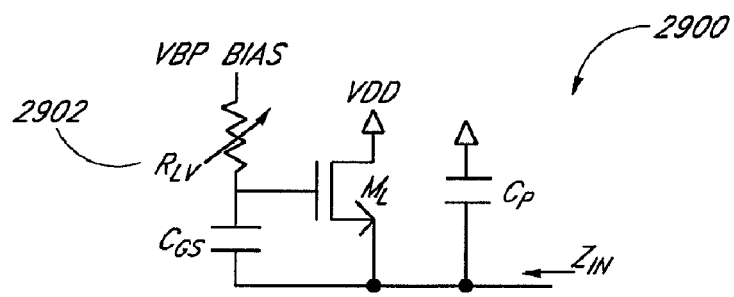
FIG. 29 illustrates one embodiment of a tunable active load.

FIG. 29 illustrates one embodiment of a tunable active load 2900. It is also possible to tune the amount of peaking on the loads by varying the peaking resistor value. This method of control is advantageous in designs where specific control over the amount of peaking is desired. This methodology can be applied to either type of load, that is, to either the PMOS active load structure 2500 described earlier in connection with FIG. 25 or to the NMOS active load structure 900 described earlier in connection with FIG. 9. For example, FIG. 29 illustrates an embodiment applying the tunable load concepts to an NMOS active load. The PMOS load embodiment is similar. In the illustrated embodiment, the resistance $R_L$ 902 of FIG. 9 is replaced with a variable resistance $R_{LV}$ 2902.

In the illustrated tunable active load 2900, the tunable portion of the tunable active load 2900 is implemented with the variable resistance $R_{LV}$ 2902. In one embodiment, the variable resistance $R_{LV}$ 2902 corresponds to an NMOS device, although it will be appreciated by one of ordinary skill in the art that virtually any element that has a controllable resistance can be used.

The tunable active load 2900 changes the amount of loading through the adjustment in the amount of resistance of the variable resistance $R_{LV}$ 2902. If the amount of resistance is increased, the amount of peaking also increases. If the amount of resistance is decreased, the amount of peaking is reduced. This can be useful in applications where the peaking needs to be compensated by methods other than the bias method described herein. The tuned peaking can also be advantageously used in applications where various speed and drive issues are present.

Advantageously, the principles of the tunable load can be applied to various types of the CML logic cell described earlier in connection with FIGS. 12-15 and to the buffer described earlier in connection with FIG. 8.

Example Applications

Relatively many embodiments exist for varying applications. Returning now to an earlier described example, FIG. 21 illustrates one embodiment for relatively high-speed data serialization and deserialization (SERDES). For example, relatively high-speed incoming data is initially processed using actively-peaked current-mode logic circuitry. The actively-peaked current-mode logic circuitry advantageously reduces a relatively high-speed data stream, such as an incoming 5 Gb/s data stream, down to a relatively slow data stream, such as to 8 data streams of 625 Mb/s. These relatively slower data streams can then be advantageously processed by, for example, conventional CMOS logic. For example, the conventional CMOS logic can then provide as an output, 8 processed data streams at 625 Mb/s, which can then be up-converted by actively-peaked current mode logic and provided as an output as a single 5 Gb/s data stream.

It will be appreciated by one of ordinary skill in the art that the embodiment illustrated in FIG. 21 is subject to relatively many different variations. For example, the interface speeds can vary. For example, the actively-peaked current mode logic can operate at a varying rate, such as the same rate or higher, than the conventional CMOS logic. Also, the relatively high-speed current-mode logic using active peaking can also be configured to perform some high-speed data processing other than serialization and/or deserialization conversions.

Figure 30:
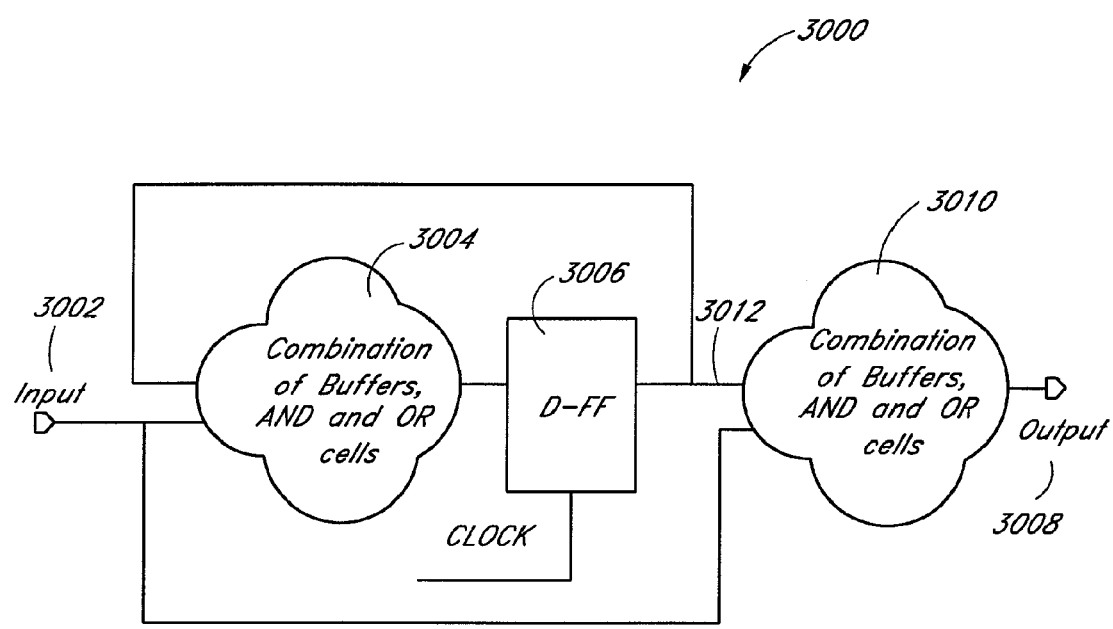
FIG. 30 illustrates one example of a state machine diagram.

In one embodiment, actively-peaked current-mode logic circuitry is used to embody relatively high-speed state machines. One example of a relatively simple single flip-flop state machine 3000 is illustrated in FIG. 30. In the illustrated single flip-flop state machine 3000, data from an input 3002 is provided to a first combination of logic cells 3004, which can include "AND" cells, "mux" cells, "OR" cells, and the like. A flip-flop 3006 stores the current state of the operation. The output 3008 is determined using a second combination of logic cells 3010, which can include "AND" cells, "mux" cells and "OR" cells, with both the input 3002 and the current state 3012 provided as inputs to the second combination of logic cells 3010. In addition, the current state 3012 can also be provided as an input to the first combination of logic cells 3004 to provide the previous state.

The principles and advantages of the illustrated single flip-flop state machine 3000 can be applied to the generalized case with the usage of these cells with any number of possible inputs (zero or more), any number of internal flip-flops (one or more), and any number of outputs (one or more).

Other Applications

Embodiments are applicable to relatively many high-speed data processing operations including, but not limited to: high-speed state machines, parallel-to-serial converters, serial-to-parallel converters, clock synthesis and clock and data recovery, transmitter control circuitry, receiver control circuitry, and the like. While generally described in the context of Serial-Deserializers (SERDES), the skilled artisan will appreciate that the principles and advantages described herein can be applied to environments in which relatively-high speed state machines are used, such as in microprocessors and graphic processors.

The current mode logic cells with active peaking can advantageously be used in the production of a broad range of commercial products. For example, the high-speed current mode logic cells with active peaking can be used in high-speed state machines for high clock rate microprocessors. The high-speed current mode logic cells with active peaking can be used to implement relatively high-end graphics processors for desktop PCs or for relatively high-end mainframes and graphics terminals. The logic has the potential to be used in high-speed backplane drivers that require serial-deserializer (SERDES) functionality.

These are just some examples of potential commercial uses of embodiments. One of ordinary skill in the art will appreciate that there are an infinite number of possible uses of embodiments on an integrated circuit process that has MOS devices. High-speed data processing is common in many fields of the industry and embodiments have implications in relatively many of these fields.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. An integrated circuit comprising:
   a voltage bias source having at least a first voltage bias and a second voltage bias, wherein the first voltage bias is of higher voltage than the second voltage bias;
   a first logic cell of current mode logic (CML) having at least a first differential input, a second differential input, and a first differential output, wherein the first logic cell further comprises:

a first differential pair of transistors operatively coupled to the first differential input and operatively coupled to the first differential output;
   a second differential pair of transistors operatively coupled to the second differential input, wherein at least a portion of the second differential pair is operatively coupled to the first differential pair of transistors; and
   a first active load having an inductive characteristic coupled to the first differential pair of transistors such that the first differential pair of transistors is electrically disposed between the first active load and the second differential pair of transistors, wherein the first active load is operatively coupled to the first voltage bias; and
   a second logic cell having at least a third differential input and a second differential output:
   a third differential pair of transistors operatively coupled to the third differential input and to the second differential output, wherein the second differential output of the third differential pair of transistors is operatively coupled to the second differential input of the second differential pair of transistors; and
   a second active load of current mode logic (CML) having an inductive characteristic coupled to the third differential pair of transistors, wherein the second active load is operatively coupled to the second voltage bias.

2. The integrated circuit of claim 1, wherein the first logic cell comprises an "AND" cell, an "OR" cell, a "mux" cell, a latch cell, or a flip-flop cell.

3. The integrated circuit of claim 1, wherein the second logic cell comprises a buffer.

4. The integrated circuit of claim 1, wherein the first logic cell comprises a D-type flip-flop cell, wherein the second logic cell comprises a level-shift buffer for clock inputs of the D-type flip-flop cell.

5. The integrated circuit of claim 1, wherein the integrated circuit is embodied in a data serialization and deserialization (SERDES) circuit.

6. The integrated circuit of claim 1, wherein the integrated circuit is embodied in a state machine.

7. The integrated circuit of claim 1, wherein the voltage bias source comprises a current mirror circuit configured to drive a mirrored current through a resistor and a diode-connected transistor, wherein a first terminal of the resistor is coupled to a gate terminal of the diode-connected transistor, wherein a second terminal of the resistor is coupled to a drain terminal of the diode-connected transistor, wherein the first voltage bias is available at the first terminal of the resistor and the second voltage bias is available at the second terminal of the resistor such that a voltage difference between the first voltage bias and the second voltage bias corresponds to a voltage drop from the first terminal to the second terminal of the resistor.

8. The integrated circuit of claim 7, wherein voltage bias source is configured to generate the mirrored current such that it is proportional to a product of a transconductance $g_m$ of a transistor of the first active load or the second active load and to a resistance of a second resistor in series with a gate of the transistor.

9. The integrated circuit of claim 8, wherein the current-mirror circuit comprises a delta-$V_{GS}$ bias circuit.

10. The integrated circuit of claim 1, wherein the first differential pair of transistors, the second differential pair of transistors, and the third differential pair of transistors are implemented with NMOS, wherein the first active load further comprises:
a first resistor with a first terminal and a second terminal;
a second resistor with a first terminal and a second terminal; and
a first NMOS transistor with a source terminal, a gate terminal, and a drain terminal; and
a second NMOS transistor with a source terminal, a gate terminal, and a drain terminal;
wherein the source terminals of the first NMOS transistor and the second NMOS transistor are operatively coupled to the first differential pair of transistors, wherein the drain terminals of the first NMOS transistor and the second NMOS transistor are operatively coupled to a first voltage reference, wherein the gate terminal of the first NMOS transistor is operatively coupled to the first terminal of the first resistor, wherein the gate terminal of the second NMOS transistor is coupled to the first terminal of the second resistor, and wherein the second terminals of the first resistor and the second resistor are operatively coupled to the first voltage bias.

11. The integrated circuit of claim 8, wherein the second active load further comprises:
a third resistor with a first terminal and a second terminal;
a fourth resistor with a first terminal and a second terminal; and
a third NMOS transistor with a source terminal, a gate terminal, and a drain terminal; and
a fourth NMOS transistor with a source terminal, a gate terminal, and a drain terminal;
wherein the source terminals of the third NMOS transistor and the third NMOS transistor are operatively coupled to the third differential pair of transistors, wherein the drain terminals of the third NMOS transistor and the fourth NMOS transistor are operatively coupled to the first voltage reference, wherein the gate terminal of the third NMOS transistor is coupled to the first terminal of the third resistor, wherein the gate terminal of the fourth NMOS transistor is operatively coupled to the first terminal of the fourth resistor, and wherein the second terminals of the third resistor and the fourth resistor are operatively coupled to the second voltage bias.

12. The integrated circuit of claim 1, wherein the first differential pair of transistors, the second differential pair of transistors, and the third differential pair of transistors are implemented with NMOS, wherein the second active load further comprises:
a first resistor with a first terminal and a second terminal;
a second resistor with a first terminal and a second terminal; and
a first NMOS transistor with a source terminal, a gate terminal, and a drain terminal; and
a second NMOS transistor with a source terminal, a gate terminal, and a drain terminal;
wherein the source terminals of the first NMOS transistor and the second NMOS transistor are operatively coupled to the third differential pair of transistors, wherein the drain terminals of the first NMOS transistor and the second NMOS transistor are operatively coupled to a first voltage reference, wherein the gate terminal of the first NMOS transistor is coupled to the first terminal of the first resistor, wherein the gate terminal of the second NMOS transistor is coupled to the first terminal of the second resistor, and wherein the second terminals of the first resistor and the second resistor are coupled to the second voltage bias.

13. The integrated circuit of claim 1, wherein the first differential pair of transistors, the second differential pair of transistors, and the third differential pair of transistors are implemented with NMOS, wherein the first active load further comprises:
a first resistor with a first terminal and a second terminal;
a second resistor with a first terminal and a second terminal;
a first PMOS transistor with a source terminal, a gate terminal, and a drain terminal, wherein the drain terminal of the first PMOS transistor is operatively coupled to the first differential pair of transistors; and
a second PMOS transistor with a source terminal, a gate terminal, and a drain terminal, wherein the drain terminal of the second PMOS transistor is operatively coupled to the first differential pair of transistors;
a first current source with a first terminal operatively coupled to the gate terminal of the first PMOS transistor;
a second current source with a first terminal operatively coupled to the gate terminal of the second PMOS transistor; and
wherein the first terminal of the first resistor is operatively coupled to the gate terminal of the first PMOS transistor, wherein the second terminal of the first resistor is operatively coupled to the drain terminal of the first PMOS transistor, wherein the source terminal of the first PMOS transistor is coupled to a first voltage reference, wherein the first terminal of the second resistor is operatively coupled to the gate terminal of the second PMOS transistor, wherein the second terminal of the second resistor is operatively coupled to the drain terminal of the second PMOS transistor, and wherein the source terminal of the first PMOS transistor is coupled to the first voltage reference.

14. The integrated circuit of claim 11, wherein the second active load further comprises:
a third resistor with a first terminal and a second terminal;
a fourth resistor with a first terminal and a second terminal;
a third PMOS transistor with a source terminal, a gate terminal, and a drain terminal, wherein the drain terminal of the third PMOS transistor is operatively coupled to the third differential pair of transistors; and
a fourth PMOS transistor with a source terminal, a gate terminal, and a drain terminal, wherein the drain terminal of the fourth PMOS transistor is operatively coupled to the third differential pair of transistors;
a third current source with a first terminal operatively coupled to the gate terminal of the third PMOS transistor;
a fourth current source with a first terminal operatively coupled to the gate terminal of the fourth PMOS transistor; and
wherein the first terminal of the third resistor is operatively coupled to the gate terminal of the third PMOS transistor, wherein the second terminal of the third resistor is operatively coupled to the drain terminal of the third PMOS transistor, wherein the source terminal of the third PMOS transistor is coupled to the first voltage reference, wherein the first terminal of the fourth resistor is operatively coupled to the gate terminal of the fourth PMOS transistor, wherein the second terminal of the fourth resistor is operatively coupled to the drain terminal of the fourth PMOS transistor, and wherein the source terminal of the third PMOS transistor is coupled to the first voltage reference.

15. The integrated circuit of claim 1, wherein the first differential pair of transistors, the second differential pair of transistors, and the third differential pair of transistors are implemented with NMOS, wherein the second active load further comprises:
   a first resistor with a first terminal and a second terminal;
   a second resistor with a first terminal and a second terminal;
   a first PMOS transistor with a source terminal, a gate terminal, and a drain terminal, wherein the drain terminal of the first PMOS transistor is operatively coupled to the third differential pair of transistors; and
   a second PMOS transistor with a source terminal, a gate terminal, and a drain terminal, wherein the drain terminal of the second PMOS transistor is operatively coupled to the third differential pair of transistors;
   a first current source with a first terminal operatively coupled to the gate terminal of the first PMOS transistor;
   a second current source with a first terminal operatively coupled to the gate terminal of the second PMOS transistor; and
   wherein the first terminal of the first resistor is operatively coupled to the gate terminal of the first PMOS transistor, wherein the second terminal of the first resistor is operatively coupled to the drain terminal of the first PMOS transistor, wherein the source terminal of the first PMOS transistor is coupled to a first voltage reference, wherein the first terminal of the second resistor is operatively coupled to the gate terminal of the second PMOS transistor, wherein the second terminal of the second resistor is operatively coupled to the drain terminal of the second PMOS transistor, and wherein the source terminal of the first PMOS transistor is coupled to the first voltage reference.

16. An integrated circuit comprising:
   a level-shift buffer of current mode logic (CML) configured to receive a differential input signal, wherein the level-shift buffer has an active load with an inductive characteristic, wherein the level-shift buffer is configured to generate a differential output signal from the differential input signal that is level shifted from a level of the differential input signal; and
   a logic cell of current mode logic (CML), wherein the logic cell has an active load with an inductive characteristic, wherein the logic cell has at least a first differential input and a second differential input, wherein a first differential input is intended to be operated with a level shift relative to the second differential input, wherein logic cell is coupled to the level-shift buffer such that one of the first differential input or the second differential input of the logic cell is coupled to the differential output signal of the level-shift buffer.

17. The integrated circuit of claim 16, wherein the logic cell comprises at least a first differential pair of transistors and a second differential pair of transistors, wherein the first differential pair of transistors is at a different electrical level than the second differential pair of transistors.

18. The integrated circuit of claim 16, further comprising a voltage bias source having at least a first voltage bias and a second voltage bias, wherein the first voltage bias is different than the second voltage bias, wherein the first voltage bias is coupled to the logic cell, and wherein the second voltage bias is coupled to the level-shift buffer.

19. The integrated circuit of claim 16, wherein the logic cell comprises an "AND" cell, an "OR" cell, a "mux" cell, a latch cell, or a flip-flop cell.

20. The integrated circuit of claim 16, wherein the integrated circuit is embodied in a data serialization and deserialization (SERDES) circuit.

21. An integrated circuit with a differential input and a differential output, the integrated circuit comprising:
   a differential circuit with a first NMOS transistor and a second NMOS transistor, where the first NMOS transistor has a source, a gate, and a drain, and the second NMOS transistor has a source, a gate, and a drain, wherein the source of the first NMOS transistor and the source of the second NMOS transistor are coupled, wherein the gate of the first NMOS transistor and the gate of the second NMOS transistor are configured to receive the differential input, and wherein the drain of the first NMOS transistor and the drain of the second NMOS transistor are configured to provide the differential output;
   a first current source with at least a first terminal, wherein the first terminal of the first current source is coupled to the source of the first NMOS transistor and to the source of the second NMOS transistor;
   a first active load with at least a first terminal coupled to the drain of the first NMOS transistor of the differential circuit, wherein the first terminal of the first active load has an inductive impedance characteristic as seen from the drain of the first NMOS transistor;
   a second active load coupled to the drain of the second NMOS transistor of the differential circuit, wherein the second active load has an inductive impedance characteristic as seen from the drain of the second NMOS transistor;
   a current mirror circuit configured to generate a mirrored current;
   a resistor having a first terminal and a second terminal, wherein the first terminal is coupled to the current mirror circuit; and
   a bias transistor having a gate terminal, a source terminal, and a drain terminal, wherein the first terminal of the resistor is coupled to the gate terminal of the bias transistor, wherein the second terminal of the resistor is coupled to the drain terminal of the bias transistor such that the bias transistor is diode connected via the resistor, wherein the first terminal of the resistor or the second terminal of the resistor is coupled to the first active load or the second active load for biasing.

22. The integrated circuit of claim 21, wherein voltage bias source is configured to generate the mirrored current such that it is proportional to a product of a transconductance $g_m$ of a transistor of the first active load or the second active load and to a resistance of a second resistor in series with a gate of the transistor.

23. The integrated circuit of claim 21, wherein the current-mirror circuit comprises a delta-$V_{GS}$ bias circuit.

* * * * *